(12) United States Patent
Onishi et al.

(10) Patent No.: US 10,389,268 B2
(45) Date of Patent: Aug. 20, 2019

(54) AC-DC POWER CONVERSION DEVICE INCLUDING HELICALLY CASCADED UNIT CELLS

(71) Applicant: Mitsubishi Electric Corporation, Chiyoda-ku, Tokyo (JP)

(72) Inventors: Ryota Onishi, Tokyo (JP); Shigeo Hayashi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/551,732

(22) PCT Filed: Apr. 6, 2015

(86) PCT No.: PCT/JP2015/060721
§ 371 (c)(1),
(2) Date: Aug. 17, 2017

(87) PCT Pub. No.: WO2016/162915
PCT Pub. Date: Oct. 13, 2016

(65) Prior Publication Data
US 2018/0041135 A1 Feb. 8, 2018

(51) Int. Cl.
*H02M 7/217* (2006.01)
*H02M 7/49* (2007.01)
(Continued)

(52) U.S. Cl.
CPC ........ *H02M 7/2176* (2013.01); *H01L 25/043* (2013.01); *H02J 3/36* (2013.01);
(Continued)

(58) Field of Classification Search
CPC .......... H02M 7/25; H02M 7/49; H02M 7/497; H02M 7/537; H02M 7/797; H02M 7/2176;
(Continued)

(56) References Cited

U.S. PATENT DOCUMENTS 9,099,914 B2 * 8/2015 Wissner ................ H02M 7/003
2008/0232145 A1   9/2008 Hiller et al.
(Continued)

FOREIGN PATENT DOCUMENTS

CN    102882356 A    1/2013
EP    2 541 752 A1   1/2013
(Continued)

OTHER PUBLICATIONS

International Search Report (PCT/ISA/210) dated Jun. 23, 2015, by the Japanese Patent Office as the International Searching Authority for International Application No. PCT/JP2015/060721.
(Continued)

*Primary Examiner* — Adolf D Berhane
*Assistant Examiner* — Jye-June Lee
(74) *Attorney, Agent, or Firm* — Buchanan Ingersoll & Rooney PC

(57) ABSTRACT

A multilevel converter includes a first arm connected between a positive voltage terminal and an alternating-current terminal and a second arm connected between the alternating-current terminal and a negative voltage terminal. Each of the first and second arms includes a plurality of cascaded unit cells. Each unit cell has a capacitor charged to a direct-current voltage and outputs a voltage across terminals of the capacitor or 0 V. The plurality of unit cells as being helically cascaded implement a reactor.

12 Claims, 25 Drawing Sheets

(51) Int. Cl.
    *H02M 7/797*   (2006.01)
    *H02M 7/25*    (2006.01)
    *H02M 7/497*   (2007.01)
    *H02M 7/537*   (2006.01)
    *H01L 25/04*   (2014.01)
    *H02M 7/00*    (2006.01)
    *H02J 3/36*    (2006.01)
    *H02M 7/483*   (2007.01)

(52) U.S. Cl.
    CPC ............ *H02M 7/003* (2013.01); *H02M 7/25* (2013.01); *H02M 7/483* (2013.01); *H02M 7/49* (2013.01); *H02M 7/497* (2013.01); *H02M 7/537* (2013.01); *H02M 7/797* (2013.01); *H02M 2007/4835* (2013.01)

(58) Field of Classification Search
    CPC .. H02M 2007/4835; H02J 3/36; H01L 25/043
    See application file for complete search history.

(56) References Cited

U.S. PATENT DOCUMENTS

| | | | |
|---|---|---|---|
| 2010/0118578 A1 | 5/2010 | Dommaschk et al. | |
| 2012/0026767 A1 | 2/2012 | Inoue et al. | |
| 2014/0022738 A1* | 1/2014 | Hiller | H05K 7/1432 361/730 |
| 2014/0254226 A1 | 9/2014 | Nakazawa et al. | |
| 2015/0188447 A1 | 7/2015 | Jimichi et al. | |

FOREIGN PATENT DOCUMENTS

| | | |
|---|---|---|
| EP | 2800133 A1 | 11/2014 |
| JP | 08-080044 A | 3/1996 |
| JP | 2005-124262 A | 5/2005 |
| JP | 2009-506736 A | 2/2009 |
| JP | 2010-233411 A | 10/2010 |
| JP | 2011-176955 A | 9/2011 |
| JP | 2013-115837 A | 6/2013 |
| JP | 2014-116995 A | 6/2014 |
| WO | WO 2014/010474 A1 | 1/2014 |

OTHER PUBLICATIONS

Written Opinion (PCT/ISA/237) dated Jun. 23, 2015, by the Japanese Patent Office as the International Searching Authority for International Application No. PCT/JP2015/060721.

Extended European Search Report dated Oct. 19, 2018, issued by the European Patent Office in corresponding European Application No. 15888410.6. (8 pages).

European Communication dated May 16, 2019, issued by the European Patent Office in corresponding European Patent Application No. 15888410.6. (4 Pages).

* cited by examiner

FIG.3
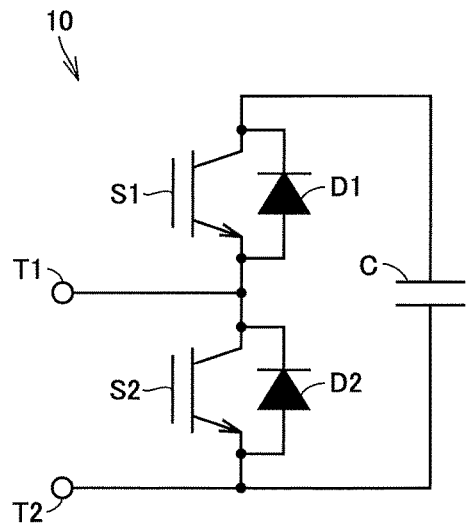
FIG.4
(a) 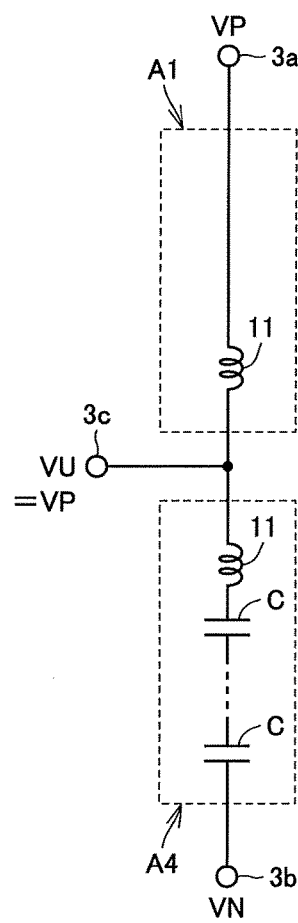
(b) 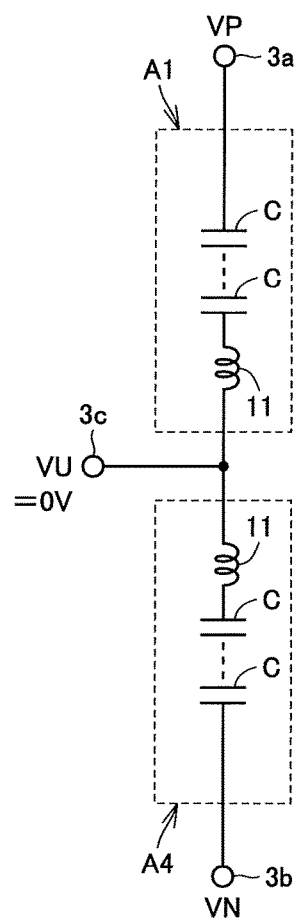
(c) 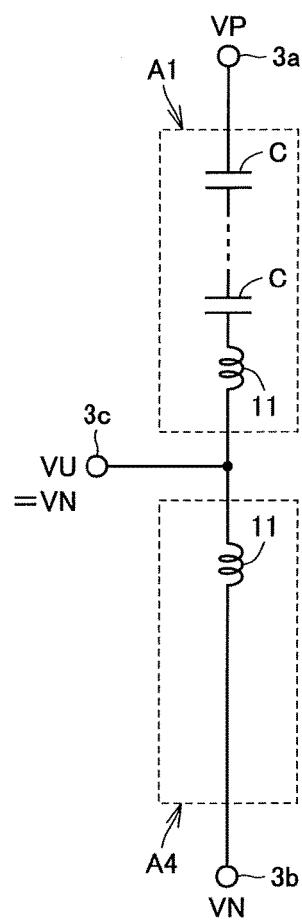

AC-DC POWER CONVERSION DEVICE INCLUDING HELICALLY CASCADED UNIT CELLS

TECHNICAL FIELD

This invention relates to a power conversion device and particularly to a power conversion device supplying and receiving electric power between an alternating-current (AC) circuit and a direct-current (DC) circuit.

BACKGROUND ART

A modular multilevel converter representing a conventional power conversion device includes a plurality of arms and a reactor connected in series to each arm. Each arm includes a plurality of cascaded unit cells. Each unit cell has a capacitor charged to a DC voltage and outputs a voltage across terminals of the capacitor or 0 V owing to a switching element. By controlling the switching element of each unit cell in each arm, any one of DC power and AC power can be converted to the other (see, for example, PTD 1 (Japanese National Patent Publication No. 2009-506736), PTD 2 (Japanese Patent Laying-Open No. 2010-233411), and PTD 3 (Japanese Patent Laying-Open No. 2013-115837)).

CITATION LIST

Patent Document

PTD 1: Japanese National Patent Publication No. 2009-506736
PTD 2: Japanese Patent Laying-Open No. 2010-233411
PTD 3: Japanese Patent Laying-Open No. 2013-115837

SUMMARY OF INVENTION

Technical Problem

In a conventional multilevel converter, however, a large and expensive reactor should be provided. Therefore, a device is disadvantageously large in size and cost is high.

Therefore, a primary object of this invention is to provide a small and inexpensive power conversion device.

Solution to Problem

A power conversion device according to this invention includes first and second DC connectors supplying and receiving DC power, an AC connector supplying and receiving AC power, a first arm connected between the first DC connector and the AC connector, and a second arm connected between the AC connector and the second DC connector. Each of the first and second arms includes a plurality of cascaded unit cells. Each unit cell has a switching element and a capacitor. At least K unit cells of the plurality of unit cells in at least one of the first and second arms are helically cascaded, and K is an integer not smaller than 2.

Advantageous Effects of Invention

In the power conversion device according to this invention, at least K unit cells of the plurality of unit cells included in the first and second arms are helically cascaded to implement a reactor. Therefore, it is not necessary to separately provide a reactor, or even when an additional reactor may separately be provided, the reactor can be made smaller in size. Therefore, a device can be reduced in size and cost.

BRIEF DESCRIPTION OF DRAWINGS

FIG. 3 is a circuit diagram showing a configuration of a unit cell shown in FIG. 2.
FIG. 4 is a circuit diagram for illustrating an operation of the multilevel converter shown in FIG. 2.

DESCRIPTION OF EMBODIMENTS

First Embodiment

Figure 1:
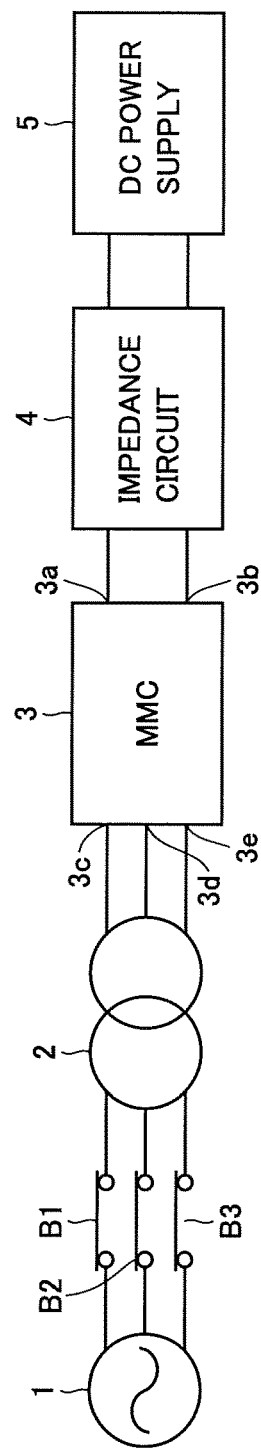
FIG. 1 is a circuit block diagram showing a configuration of a power conversion system according to a first embodiment of this invention.

FIG. 1 is a circuit block diagram showing a configuration of a power conversion system according to a first embodiment of this invention. In FIG. 1, this power conversion system includes an AC power system 1, breakers B1 to B3, a three-phase transformer 2, a modular multilevel converter (MMC) 3, an impedance circuit 4, and a DC power supply 5.

Multilevel converter 3 is a bidirectional power conversion device including a positive voltage terminal 3a (a first DC connector), a negative voltage terminal 3b (a second DC connector), and three AC terminals (AC connector) 3c to 3e and converting any one of DC power and three-phase AC power into the other. Positive voltage terminal 3a and negative voltage terminal 3b are used for supplying and receiving DC power and three AC terminals 3c to 3e are used for supplying and receiving three-phase AC power. A secondary winding of a transformer may be implemented as an AC connector and the AC connector may supply and receive AC power through a primary winding of the transformer.

Positive voltage terminal 3a and negative voltage terminal 3b are connected to DC power supply 5 with impedance circuit 4 being interposed. Impedance circuit 4 suppresses a flow of a signal having a switching frequency generated by multilevel converter 3 to DC power supply 5. DC power supply 5 supplies and receives DC power to and from multilevel converter 3 through impedance circuit 4. A DC load may be connected instead of DC power supply 5 and another multilevel converter may be connected.

Three AC terminals 3c to 3e of multilevel converter 3 are connected to three secondary-side terminals of three-phase transformer 2. Three primary-side terminals of three-phase transformer 2 are connected to three-phase electric power transmission lines of AC power system 1 with breakers B1 to B3 being interposed, respectively. Three-phase transformer 2 supplies and receives three-phase AC power between multilevel converter 3 and AC power system 1. Breakers B1 to B3 are rendered conducting during a normal operation, and for example, when short-circuiting occurs between terminals 3a and 3b, they are rendered non-conducting for protecting the power conversion system.

Operations of the power conversion system will now be described. When electric power is supplied from AC power system 1 to DC power supply 5, three-phase AC power of AC power system 1 is supplied to multilevel converter 3 through breakers B1 to B3 and three-phase transformer 2 and converted to DC power by multilevel converter 3. DC power generated by multilevel converter 3 is supplied to DC power supply 5 through impedance circuit 4. Multilevel converter 3 operates as an AC-DC conversion device which converts AC power into DC power.

In contrast, when electric power is supplied from DC power supply 5 to AC power system 1, DC power generated by DC power supply 5 is supplied to multilevel converter 3 through impedance circuit 4 and converted to three-phase AC power by multilevel converter 3. Three-phase AC power generated by multilevel converter 3 is supplied to AC power system 1 through three-phase transformer 2 and breakers B1 to B3. Multilevel converter 3 operates as a DC-AC conversion device which converts DC power from DC power supply 5 into AC power.

Figure 2:
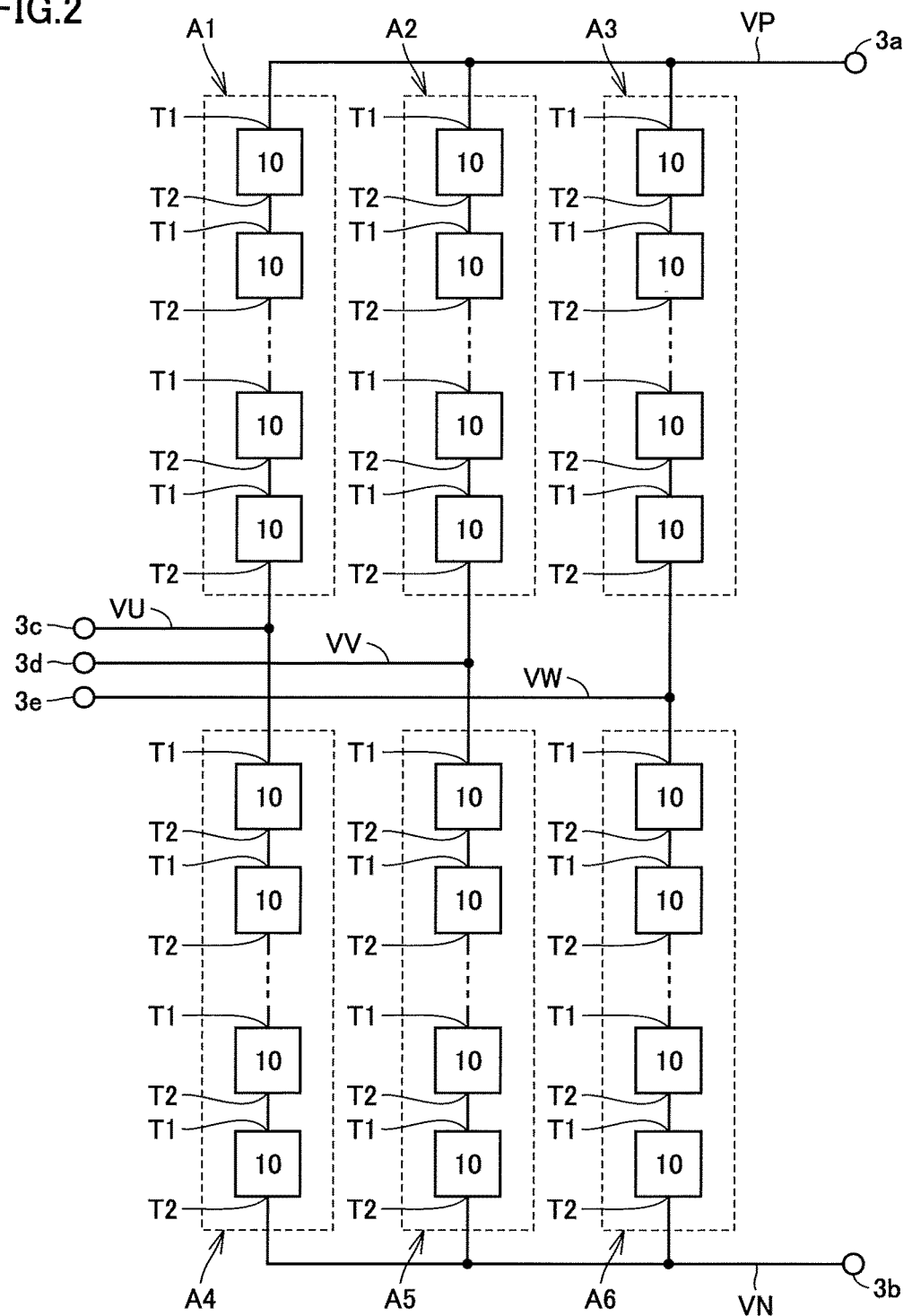
FIG. 2 is a circuit block diagram showing a main portion of a multilevel converter shown in FIG. 1.

FIG. 2 is a circuit block diagram showing a main portion of multilevel converter 3. In FIG. 2, multilevel converter 3 includes positive voltage terminal 3a, negative voltage terminal 3b, AC terminals 3c to 3e, and arms A1 to A6.

A positive DC voltage VP is supplied from multilevel converter 3 and DC power supply 5 to positive voltage terminal 3a. A negative DC voltage VN is supplied from multilevel converter 3 and DC power supply 5 to negative voltage terminal 3b. A U-phase AC voltage VU is supplied from three-phase transformer 2 and multilevel converter 3 to AC terminal 3c. A V-phase AC voltage VV is supplied from three-phase transformer 2 and multilevel converter 3 to AC terminal 3d. A W-phase AC voltage VW is supplied from three-phase transformer 2 and multilevel converter 3 to AC terminal 3e. Three-phase AC voltages VU, VV, and VW are out of phase with one another by 120 degrees.

Arms A1 to A3 have one terminals each connected to positive voltage terminal 3a in common and the other terminals connected to AC terminals 3c to 3e, respectively. Arms A4 to A6 have one terminals connected to AC terminals 3c to 3e, respectively, and the other terminals each connected to negative voltage terminal 3b in common.

Arms A1 and A4 implement a U-phase module (a first phase module) performing AC-DC conversion and DC-AC conversion between U-phase AC voltage VU and DC voltages VP and VN. Arms A2 and A5 implement a V-phase module (a second phase module) performing AC-DC conversion and DC-AC conversion between V-phase AC voltage VV and DC voltages VP and VN. Arms A3 and A6 implement a W-phase module (a third phase module) performing AC-DC conversion and DC-AC conversion between W-phase AC voltage VW and DC voltages VP and VN.

Each of arms A1 to A6 includes a plurality of cascaded unit cells 10. Though detailed description will be given later, a plurality of unit cells 10 as being cascaded helically (in a form like a coil) implement a reactor. An inductance of the reactor controls a current which flows through each arm A and is set to a value necessary for suppressing a circulating current which flows among three phase modules when AC voltages VU, VV, and VW are different in amplitude. Since the plurality of unit cells 10 as being helically cascaded thus implement a reactor, a device can be reduced in size and cost as compared with an example in which a reactor is separately provided.

Though only a reactor implemented by a plurality of helically cascaded unit cells 10 may suppress a circulating current, a circulating current may be suppressed by connecting a reactor implemented by a plurality of unit cells 10 and a conventional reactor in series. In this case, the sum of an inductance of the reactor implemented by the plurality of unit cells 10 and an inductance of the conventional reactor is set to a value necessary for suppressing a circulating current which flows among the three phase modules.

As shown in FIG. 3, each unit cell 10 includes a first terminal T1, a second terminal T2, switching elements S1 and S2, diodes D1 and D2, and a capacitor C. Each of switching elements S1 and S2 is implemented, for example, by an insulated gate bipolar transistor (IGBT). Switching elements S1 and S2 are connected in series between a positive electrode and a negative electrode of capacitor C. Switching element S1 has a collector connected the positive electrode of capacitor C and an emitter connected to first terminal T1 and a collector of switching element S2 and switching element S2 has an emitter connected to second terminal T2 and the negative electrode of capacitor C.

Diodes D1 and D2 are connected in anti-parallel to switching elements S1 and S2, respectively. Diodes D1 an D2 have anodes connected to the emitters of switching elements S1 and S2, respectively, and cathodes connected to the collectors of switching elements S1 and S2, respectively. Each of diodes D1 and D2 is a freewheel diode.

As shown in FIG. 2, first terminals T1 of unit cells 10 at one ends of arms A1 to A3 are all connected to positive voltage terminal 3a. In arms A1 to A3, second terminal T2 of each unit cell 10 is connected to first terminal T1 of unit cell 10 adjacent on a side of AC terminals 3c to 3e. Second terminals T2 of unit cells 10 at the other ends of arms A1 to A3 are connected to AC terminals 3c to 3e, respectively.

First terminals T1 of unit cells 10 at one ends of arms A4 to A6 are connected to AC terminals 3c to 3e, respectively. In arms A4 to A6, second terminal T2 of each unit cell 10 is connected to first terminal T1 of unit cell 10 adjacent on a side of negative voltage terminal 3b. Second terminals T2 of unit cells 10 at the other ends of arms A4 to A6 are all connected to negative voltage terminal 3b.

Each unit cell 10 is set to on or off. In unit cell 10 in the on state, switching element S1 is rendered conducting, switching element S2 is rendered non-conducting, and terminals T1 and T2 are connected to the positive electrode and the negative electrode of capacitor C, respectively. When capacitor C has been charged to a DC voltage VC, DC voltage VC is output across terminals T1 and T2.

In unit cell 10 in the off state, switching element S1 is rendered non-conducting, switching element S2 is rendered conducting, terminals T1 and T2 are connected to each other, and 0 V is output across terminals T1 and T2. When capacitor C has been charged to DC voltage VC, that state is maintained.

A control device (not shown) of multilevel converter 3 operates in synchronization with three-phase AC voltages VU, VV, and VW from three-phase transformer 2, and controls switching elements S1 and S2 in each unit cell 10 in arms A1 to A6 to convert three-phase AC power from three-phase transformer 2 into DC power for supply to DC power supply 5 or to convert DC power from DC power supply 5 into three-phase AC power for supply to three-phase transformer 2. The control device controls switching elements S1 and S2 based on a voltage across terminals of capacitor C in each unit cell 10 and has capacitor C in each unit cell 10 charged to a predetermined DC voltage.

For example, an example in which switching elements S1 and S2 in each unit cell 10 in arms A1 and A4 are controlled so that a DC voltage is converted to an AC voltage will be described. K (K being an integer not smaller than 2) unit cells 10 are provided in each arm, capacitor C in each unit cell 10 has already been charged to a predetermined DC voltage VC/K, a positive DC voltage VP=+VC×K/2 is applied to positive voltage terminal 3a, and a negative DC voltage VN=−VC×K/2 is applied to negative voltage terminal 3b. K unit cells 10 in 2K unit cells 10 in total included in two arms A1 and A4 connected in series are turned on and remaining K unit cells 10 are turned off.

As shown in FIG. 4(a), when all unit cells 10 in arm A1 are turned off and all unit cells 10 in arm A4 are turned on, voltage VU of AC terminal 3c is set to VP=+VC×K/2. That is, a condition of VU=VN+VC×K=+VC×K/2=VP is satisfied. When the number of unit cells 10 set to on is gradually increased in arm A1 and the number of unit cells 10 set to on is gradually decreased in arm A4 from this state, voltage VU of AC terminal 3c gradually lowers.

As shown in FIG. 4(b), when K/2 unit cells 10 in arm A1 are set to on and K/2 unit cells 10 in arm A4 are set to on, voltage VU of AC terminal 3c is set to 0 V. That is, a condition of VU=VN+VC×K/2=VP−VC×K/2=0 is satisfied. When the number of unit cells 10 set to on is gradually increased in arm A1 and the number of unit cells 10 set to on is gradually decreased in arm A4 from this state, voltage VU of AC terminal 3c gradually lowers.

As shown in FIG. 4(c), when all unit cells 10 in arm A1 are set to on and all unit cells 10 in arm A4 are set to off, voltage VU of AC terminal 3c is set to VN=VC×K/2. That is, a condition of VU=VP−VC×K=−VC×K/2=VN is satisfied. By thus controlling each unit cell 10 in arms A1 and A4, DC voltages VP and VN can be converted to sinusoidal AC voltage VU.

Similarly, DC voltages VP and VN can be converted to sinusoidal AC voltage VV by controlling each unit cell 10 in arms A2 and A5. Furthermore, DC voltages VP and VN can be converted to sinusoidal AC voltage VW by controlling each unit cell 10 in arms A3 and A6. By setting timing of control of arms A1 and A4, arms A2 and A5, and arms A3 and A6 to be out of phase with one another by 120 degrees, DC voltages VP and VN can be converted to three-phase AC voltages VU, VV, and VW.

Since K unit cells 10 in each arm A are helically cascaded, each arm A has an inductance. An inductance of each arm A is denoted as a reactor 11 in FIG. 4(a) to (c).

When phases of three-phase AC voltages VU, VV, and VW generated by multilevel converter 3 are advanced as compared with a phase of a three-phase AC voltage output from three-phase transformer 2, AC power at a value in accordance with a phase difference flows from multilevel converter 3 to three-phase transformer 2. In this case, multilevel converter 3 operates as a DC-AC conversion device which converts DC power from DC power supply 5 into AC power for supply to three-phase transformer 2.

In contrast, when phases of three-phase AC voltages VU, VV, and VW generated by multilevel converter 3 are delayed as compared with a phase of a three-phase AC voltage output from three-phase transformer 2, AC power at a value in accordance with a phase difference flows from three-phase transformer 2 to multilevel converter 3. In this case, multilevel converter 3 operates as an AC-DC conversion device which converts AC power from three-phase transformer 2 into DC power for supply to DC power supply 5.

For example, a control device (not shown) controls each unit cell 10 in arms A1 to A6 such that currents IU, IV, RN which flow in U-phase modules A1 and A4, V-phase modules A2 and A5, and W-phase modules A3 and A6 are equal in magnitude. When currents IU, IV, and IW are not equal in magnitude, a circulating current flows between at least two phase modules of the three phase modules. The circulating current flows, for example, through a path through arms A1, A4, A5, and A2. An inductance of reactor 11 in each of arms A1 to A6 is set to a value necessary for suppressing such a circulating current.

Figure 5:
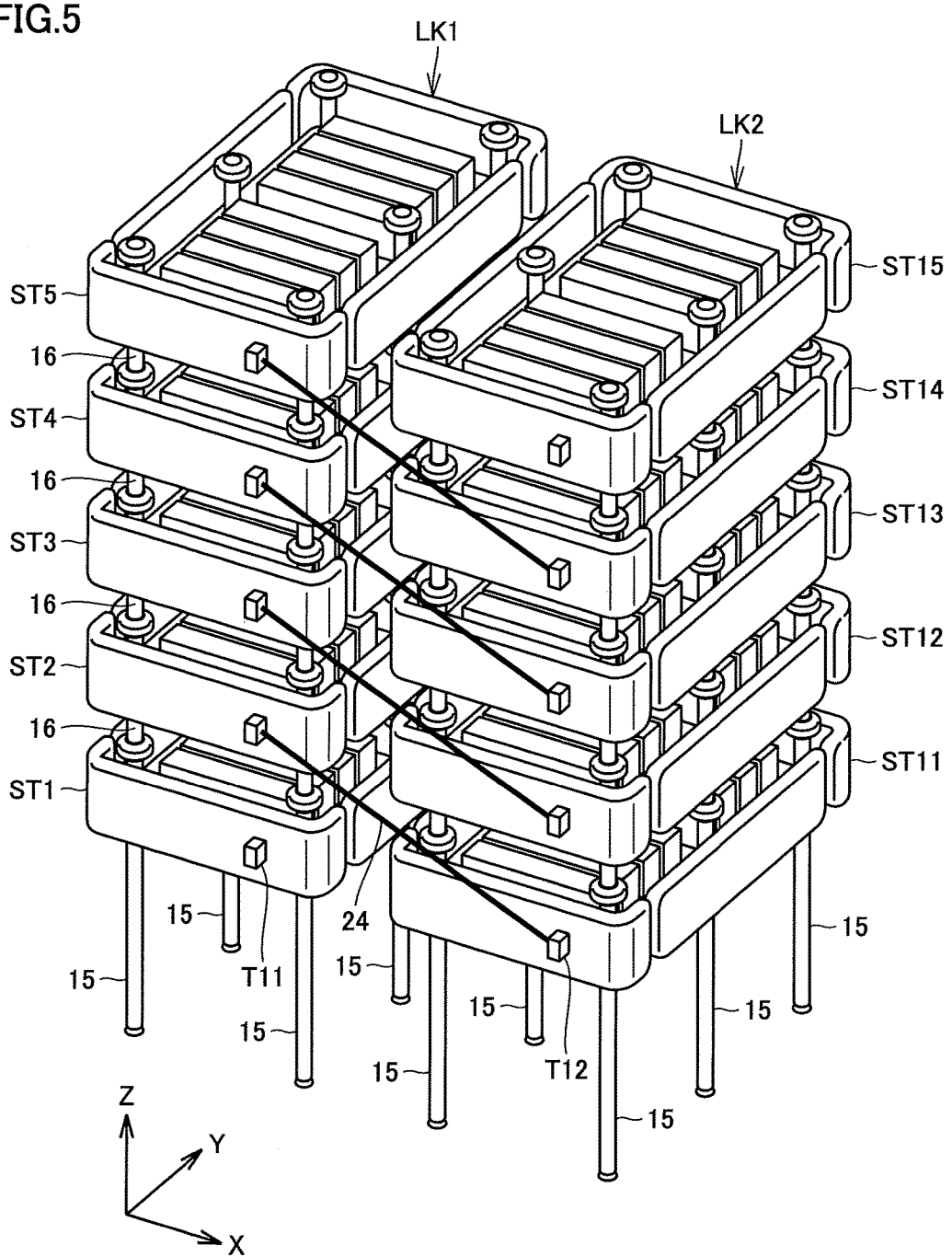
FIG. 5 is a perspective view showing a construction of an arm shown in FIG. 2.

FIG. 5 is a perspective view showing a construction of arm A1. In FIG. 5, arm A1 includes Q (Q being an integer not smaller than 2 and a condition of Q=2 being satisfied in FIG. 5) racks LK1 and LK2. Racks LK1 and LK2 are arranged adjacently in an X direction in the figure.

Rack LK1 includes N (N being an integer not smaller than 2 and a condition of N=5 being satisfied in FIG. 5) stages ST1 to ST5. Stages ST1 to ST5 are sequentially disposed in a Z direction (a direction of height) in the figure and arranged in parallel to one another. First stage ST1 is supported on a floor by six pillars 15. Stages ST2 to ST5 are supported by six pillars 16 on stages ST1 to ST4, respectively.

Rack LK2 includes N (N being an integer not smaller than 2 and a condition of N=5 being satisfied in FIG. 5) stages ST11 to ST15. Stages ST11 to ST15 are sequentially disposed in the Z direction (the direction of height) in the figure and arranged in parallel to one another. First stage ST11 is supported on the floor by six pillars 15. Stages ST12 to ST15 are supported by six pillars 16 on stages ST11 to ST14, respectively. Stages ST11 to ST15 of rack LK2 are arranged as high as stages ST1 to ST5 of rack LK1, respectively.

Figure 6:
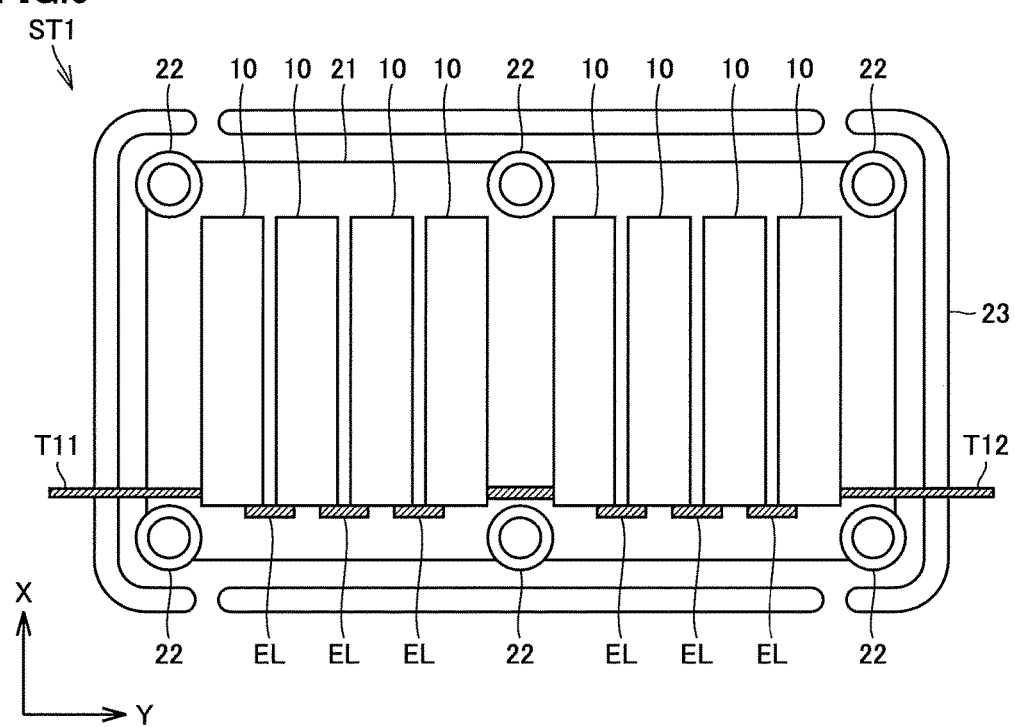
FIG. 6 is a plan view showing a construction of a stage shown in FIG. 5.

FIG. 6 is a plan view showing a construction of stage ST1. In FIG. 6, stage ST1 includes a rectangular substrate 21, six insulators 22, an insulating shield 23, a positive-side terminal T11, and a negative-side terminal T12. Substrate 21 has a short side oriented in the X direction in the figure and a long side oriented in a Y direction in the figure. Holes (not shown) are provided in six locations in a peripheral edge portion of substrate 21, six insulators 22 are fitted in six respective holes, and a central portion of each insulator 22 is fixed to substrate 21.

A hole for fitting pillar 15 or 16 is provided at an upper end portion and a lower end portion of each insulator. A perimeter of substrate 21 is surrounded by insulating shield 23. Insulating shield 23 is divided into four sections corresponding to four sides of substrate 21 and each section is fixed to substrate 21 by a fixing member (not shown).

On a surface of substrate 21, M (M being an integer not smaller than 2 and a condition of M=8 being satisfied in FIG. 6) unit cells 10, positive-side terminal T11 (a first terminal), and negative-side terminal T12 (a second terminal) are mounted. Positive-side terminal T11, eight unit cells 10, and negative-side terminal T12 are disposed in the Y direction in the figure. Positive-side terminal T11 passes through insulating shield 23 and protrudes from a front surface side of stage ST1. Negative-side terminal T12 passes through insulating shield 23 and protrudes from a rear surface side of stage ST1. Eight unit cells 10 are cascaded between terminals T11 and T12. Each of other stages ST2 to ST5 of rack LK1 is constructed similarly to stage ST1.

In each of stages ST11 to ST15 of rack LK2, positive-side terminal T11, eight unit cells 10, and negative-side terminal T12 are disposed in a direction opposite to the Y direction in the figure. Positive-side terminal T11 passes through insulating shield 23 and protrudes from a rear surface side of stage ST11. Negative-side terminal T12 passes through insulating shield 23 and protrudes from a front surface side of stage ST11. Eight unit cells 10 are cascaded between terminals T11 and T12.

Figure 7:
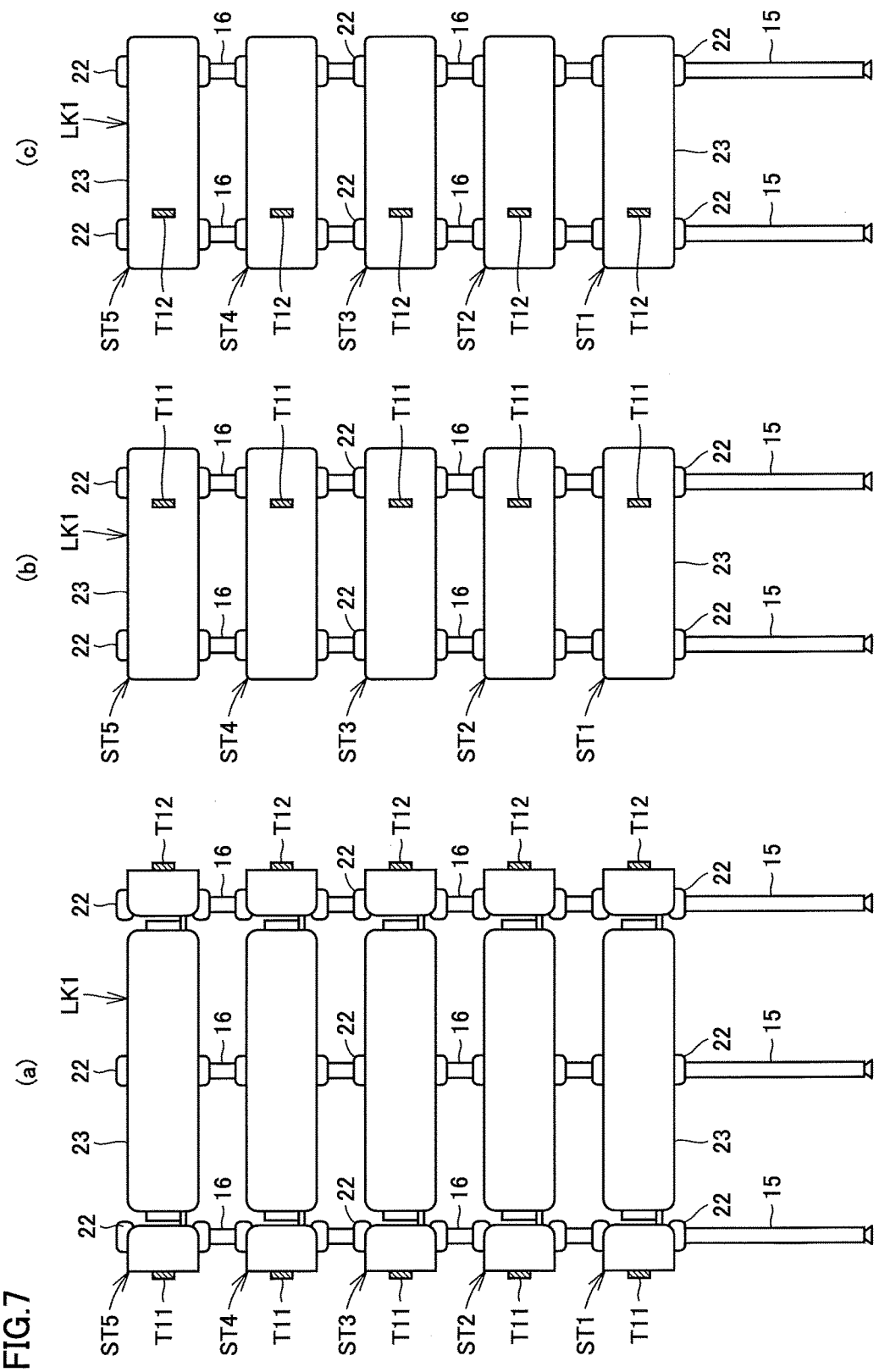
FIG. 7 is a diagram showing a construction of a rack shown in FIG. 5.

FIG. 7 (*a*) shows a side view of rack LK1, FIG. 7 (*b*) shows a front view of rack LK1, and FIG. 7 (*c*) shows a rear view of rack LK1. As shown in FIG. 7 (*a*) to (*c*), positive-side terminal T11 protrudes from the front surface side of each of stages ST1 to ST5 and negative-side terminal T12 protrudes from a rear side. In rack LK2, negative-side terminal T12 protrudes from the front surface side of each of stages ST11 to ST15 and positive-side terminal T11 protrudes from the rear surface side.

Figure 8:
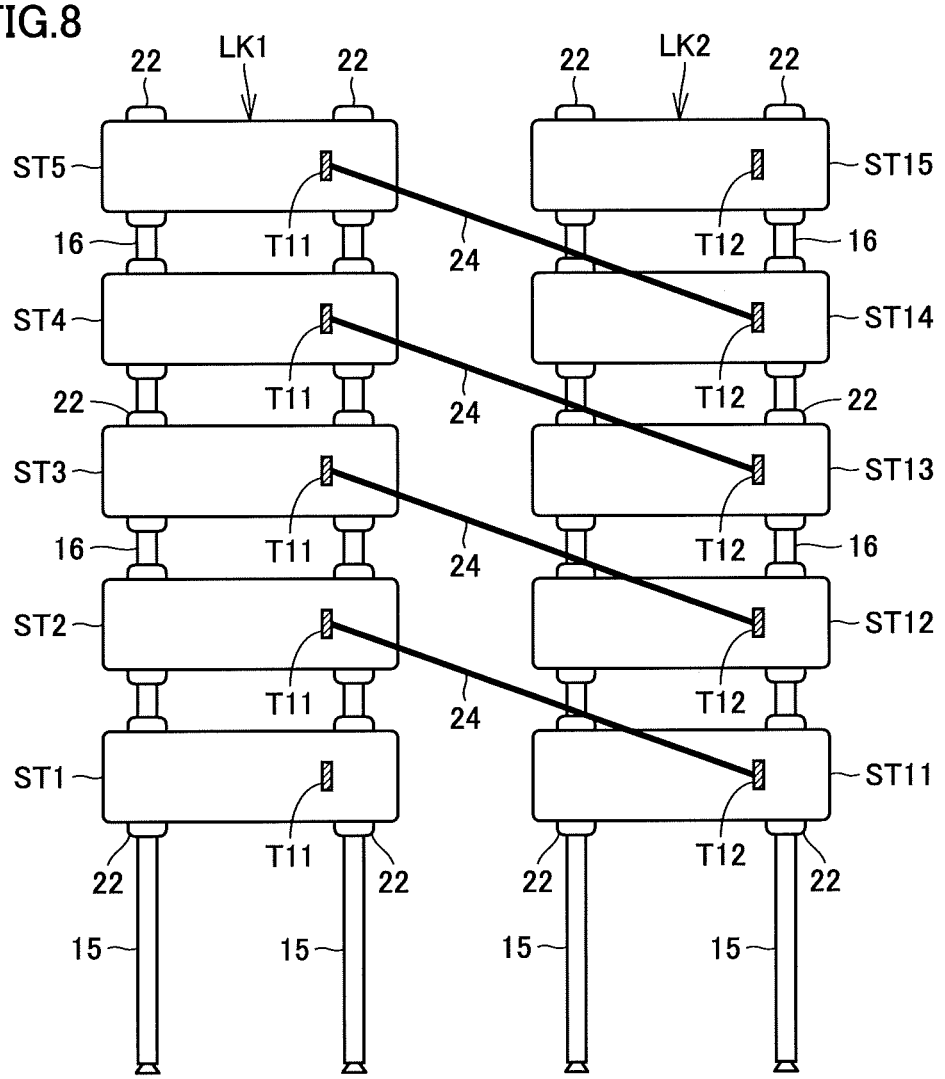
FIG. 8 is a front view showing the construction of the arm shown in FIG. 5.

FIG. 8 is a front view showing the construction of arm A1. As shown in FIG. 8, negative-side terminals T12 in stages ST11 to ST14 of rack LK2 are connected to positive-side terminals T11 in stages ST2 to ST5 of rack LK1 through four wires 24, respectively. Positive-side terminal T11 in stage ST1 of rack LK1 is connected to positive voltage terminal 3*a* shown in FIG. 2. Negative-side terminal T12 in stage ST15 of rack LK2 is connected to AC terminal 3*c* shown in FIG. 2.

Figure 9:
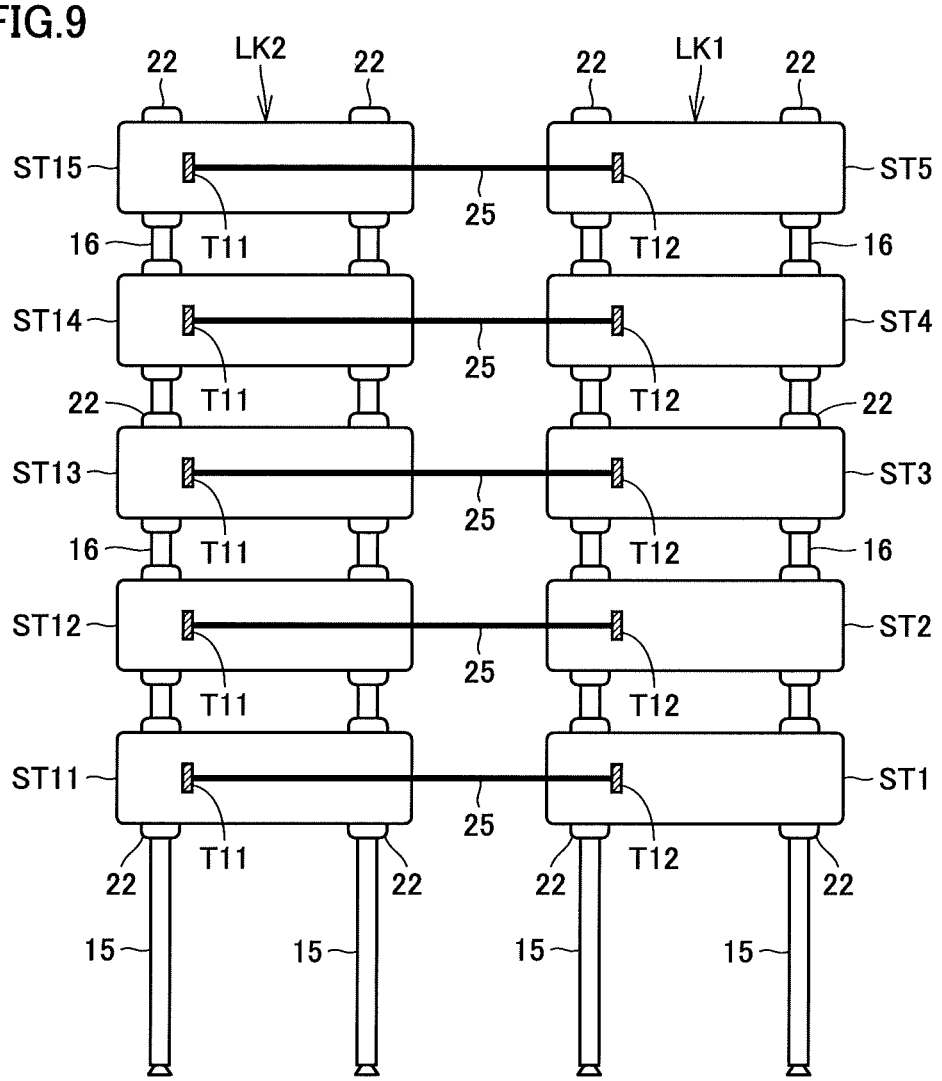
FIG. 9 is a rear view showing the construction of the arm shown in FIG. 8.

FIG. 9 is a rear view showing the construction of arm A1. As shown in FIG. 9, negative-side terminals T12 in stages ST1 to ST5 of rack LK1 are connected to positive-side terminals T11 in stages ST11 to ST15 of rack LK2 through five wires 25, respectively. For the sake of brevity of the drawings, FIG. 8 does not show wire 25 and FIG. 9 does not show wire 24.

Figure 10:
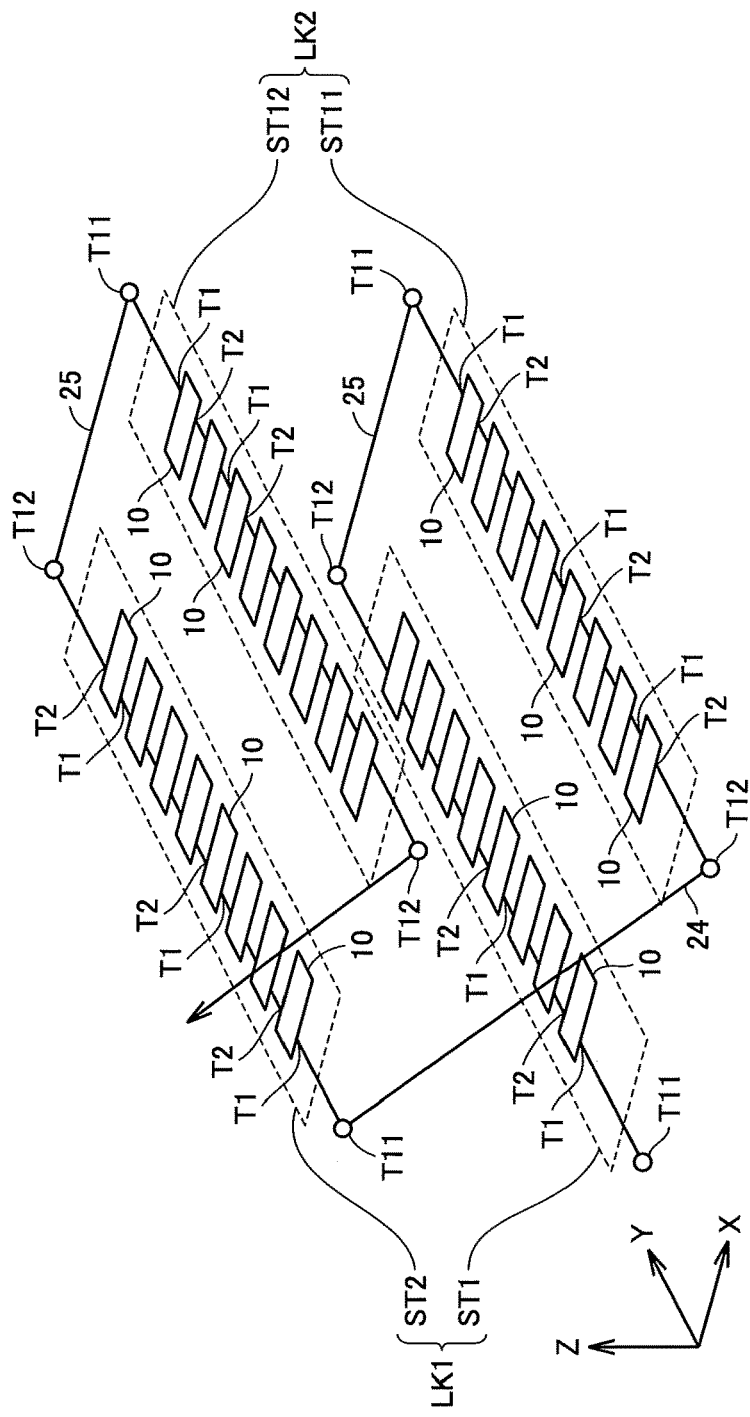
FIG. 10 is a diagram schematically showing a main portion of the arm shown in FIG. 5.

FIG. 10 is a diagram schematically showing a main portion of arm A1. FIG. 10 shows stages ST1 and ST2 (n and (n+1)th stages, n being an integer not smaller than 1, and a condition of n=1 being satisfied in FIG. 10) of rack LK1 (a first rack) and stages ST11 and ST12 (nth and (n+1)th stages, n being an integer not smaller than 1, and a condition of n=1 being satisfied in FIG. 10) of rack LK2 (a second rack). Stages ST11 and ST12 are arranged as high as stages ST1 and ST2, respectively, and arranged adjacently to stages ST1 and ST2 in the X direction, respectively.

In each of stages ST1 and ST2, positive-side terminal T11 (first terminal), eight unit cells 10, and negative-side terminal T12 (second terminal) are disposed in the Y direction (the first direction) in the figure, and eight unit cells 10 are cascaded between terminals T11 and T12. In each of stages ST11 and ST12, positive-side terminal T11, eight unit cells 10, and negative-side terminal T12 are disposed in the direction (a second direction) opposite to the Y direction in the figure, and eight unit cells 10 are cascaded between terminals T11 and T12.

Negative-side terminal T12 in stage ST1 is connected to positive-side terminal T11 in stage ST11 through wire 25. Eight unit cells 10 in stage ST1, wire 25, and eight unit cells 10 in stage ST11 are connected to form a part of a loop. Negative-side terminal T12 in stage ST11 is connected through wire 24 to positive-side terminal T11 in stage ST2 located obliquely upward.

Negative-side terminal T12 in stage ST2 is connected to positive-side terminal T11 in stage ST12 through wire 25. Eight unit cells 10 in stage ST2, wire 25, and eight unit cells 10 in stage ST12 are connected to form a part of a loop. Eight unit cells 10 in stage ST1, eight unit cells 10 in stage ST11, eight unit cells 10 in stage ST2, and eight unit cells 10 in stage ST12 are helically cascaded.

Thus, 8×10 unit cells 10 mounted on stages ST1 to ST5 and ST11 to ST15 (two sets of first to Nth stages, with a condition of N=5 being satisfied) of racks LK1 and LK2 (first to Qth racks, with a condition of Q=2 being satisfied) are helically cascaded to implement reactor 11 shown in FIG. 4(*a*) to (*c*).

In general, an inductance L of a reactor is $L=(4\times\pi\times10^{-7}\times S\times P^2)/\blacksquare$, where S represents an area of a loop, P represents the number of loops, and ■ represents a length of the reactor. For example, when a distance between positive-side terminal T11 of rack LK1 and negative-side terminal T12 of rack LK2 is set to 7 m and a distance between terminals T11 and T12 of rack LK1 is set to 8 m, $S=7\times8=56$ m$^2$ is set. When a distance between positive-side terminal T11 in stage ST1 of rack LK1 and positive-side terminal T11 in stage ST5 is set to 8 m, ■=8 m is set. The number of loops P is set to 5. When $S=8\times7=56$ m$^2$, P=5, and ■=8 m are substituted into the expression above, L of approximately 0.2 mH is obtained. Other arms A2 to A6 are also constructed similarly to arm A1.

In the first embodiment, reactor 11 is implemented by helically cascading a plurality of unit cells 10 included in each of arms A1 to A6. Therefore, it is not necessary to separately provide a reactor. Alternatively, even when an additional reactor is separately provided, the reactor can be reduced in size. Therefore, a device can be reduced in size and cost.

When a modular multilevel converter implements a three-phase power conversion device, a circulating current which flows between phase modules can be suppressed by employing reactor 11 obtained with the helical structure described above. For example, a control device (not shown) may control on and off of switching elements S1 and S2 in each unit cell 10 so as to suppress a circulating current which flows between phases based on magnitude of a detected value of the circulating current and an inductance of reactor 11 obtained with the helical structure. Alternatively, a reactor different from reactor 11 obtained with the helical structure may be added, and the control device may control switching elements S1 and S2 in each unit cell 10 so as to suppress a circulating current based on magnitude of the reactor. With such a helically connected construction, an inductance, for example, not lower than 0.1 mH and furthermore not lower than 1 mH may be obtained.

Though all unit cells 10 included in one arm A are helically connected to implement single reactor 11 in the first embodiment, limitation thereto is not intended. Some of a plurality of unit cells 10 included in one arm A may helically be connected to implement single reactor 11. A plurality of unit cells 10 included in one arm A may be divided into a plurality of groups and unit cells 10 in each group may helically be connected to implement a plurality of reactors connected in series. Furthermore, all unit cells 10 included in two arms A1 and A4 (or A2 and A5 or A3 and A6) may helically be connected to implement a single reactor. Only a plurality of unit cells 10 included in any one (for example, A1, A2, or A3) of two arms connected in series (A1 and A4, A2 and A5, or A3 and A6) may helically be cascaded to implement reactor 11.

Though two racks LK1 and LK2 are arranged and a plurality of unit cells 10 included in two stages ST at the same height are cascaded to form a part of a loop in the first embodiment, limitation thereto is not intended. Three or more racks LK may be arranged and a plurality of unit cells 10 included in three or more stages ST at the same height may be cascaded to form a part of a loop. For example, three racks LK may be arranged in a triangular shape when viewed from above and a plurality of unit cells 10 included in three stages ST at the same height may be cascaded to form a part of a loop. Four racks LK may be arranged in a quadrangular shape when viewed from above and a plurality of unit cells 10 included in four stages ST at the same height may be cascaded to form a part of a loop.

Figure 11:
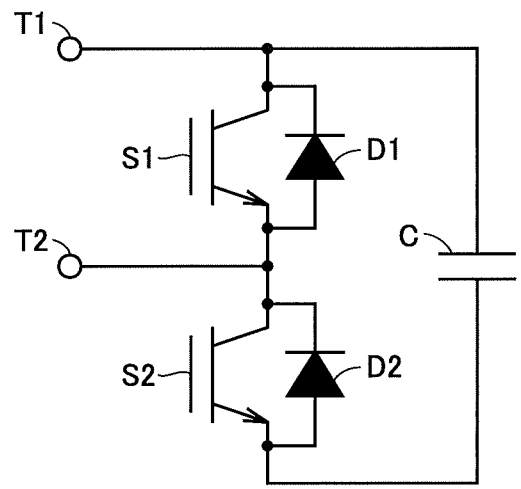
FIG. 11 is a diagram showing a modification of the first embodiment.

FIG. 11 is a circuit diagram showing a modification of the first embodiment and compared with FIG. 3. Referring to FIG. 11, in this modification, a unit cell 10A is employed instead of unit cell 10. This unit cell 10A has terminals T1 and T2 connected to the collectors of switching elements S1 and S2, respectively. When switching element S1 is turned off and switching element S2 is turned on, a voltage across terminals of capacitor C is output across terminals T1 and T2. When switching element S1 is turned on and switching element S2 is turned off, 0 V is output across terminals T1 and T2. This modification also obtains an effect the same as in the first embodiment.

Figure 12:
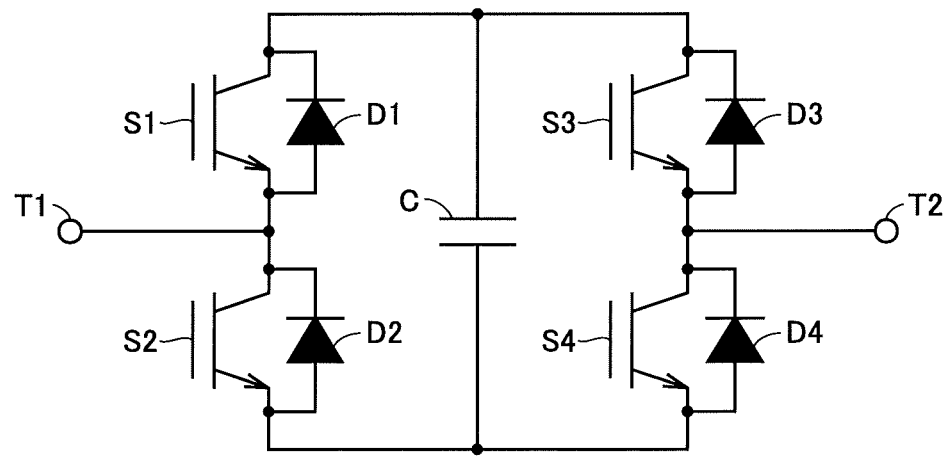
FIG. 12 is a diagram showing another modification of the first embodiment.

FIG. 12 is a circuit diagram showing another modification of the first embodiment and compared with FIG. 3. Referring to FIG. 12, in this modification, a unit cell 10B is employed instead of unit cell 10. This unit cell 10B is addition of switching elements S3 and S4 and diodes D3 and D4 to unit cell 10. Switching elements S3 and S4 are connected in series between the positive electrode and the negative electrode of capacitor C. Diodes D3 an D4 are connected in anti-parallel to switching elements S3 and S4, respectively. Terminals T1 and T2 are connected to the emitters of switching elements S1 and S3, respectively.

When switching elements S1 and S4 are turned on and switching elements S2 and S3 are turned off, a voltage across terminals of capacitor C is output across terminals T1 and T2. When switching elements S1 and S3 are turned on and switching elements S2 and S4 are turned off, 0 V is output across terminals T1 and T2. When switching elements S2 and S3 are turned on and switching elements S1 and S4 are turned off, a voltage across terminals of capacitor C is output across terminals T2 and T1. When switching elements S1 and S3 are turned off and switching elements S2 and S4 are turned on, 0 V is output across terminals T1 and T2. This modification also obtains an effect the same as in the first embodiment.

Second Embodiment

Figure 13:
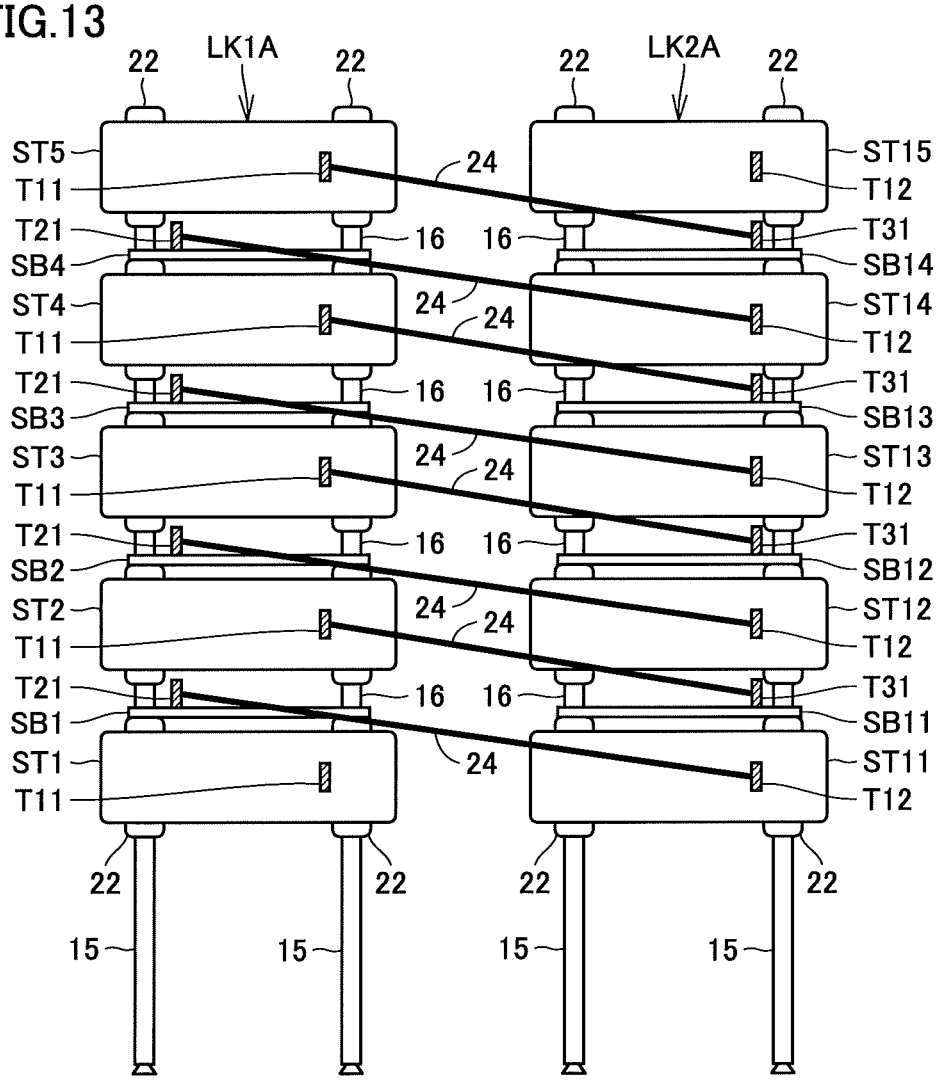
FIG. 13 is a front view showing a construction of an arm included in the multilevel converter according to a second embodiment of this invention.
Figure 14:
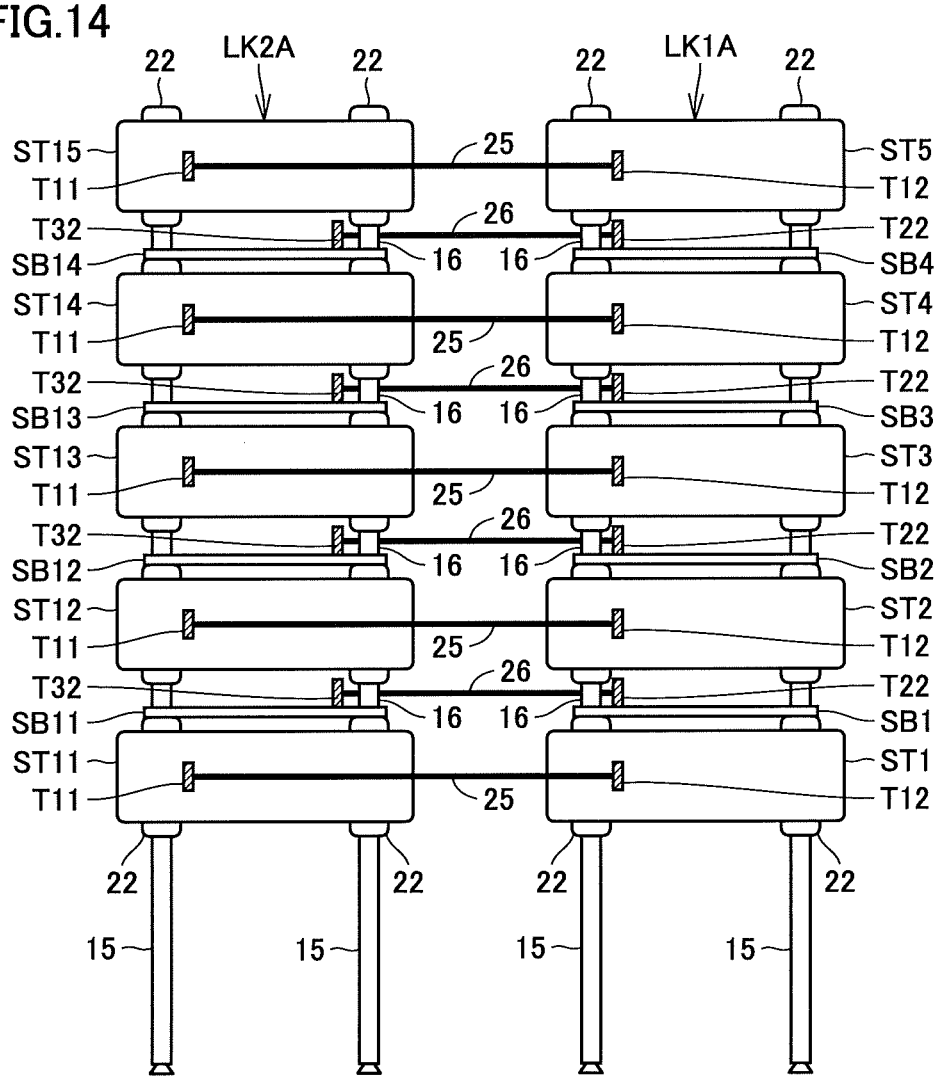
FIG. 14 is a rear view showing a construction of the arm shown in FIG. 13.
Figure 15:
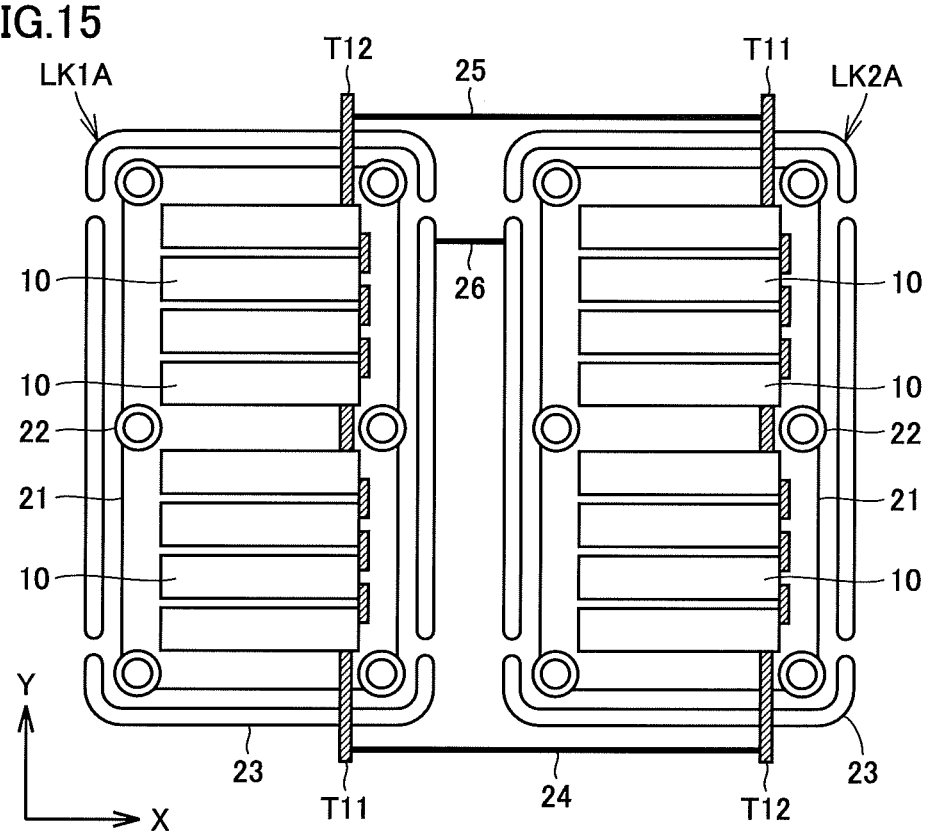
FIG. 15 is a plan view showing the construction of the arm shown in FIG. 13.
Figure 16:
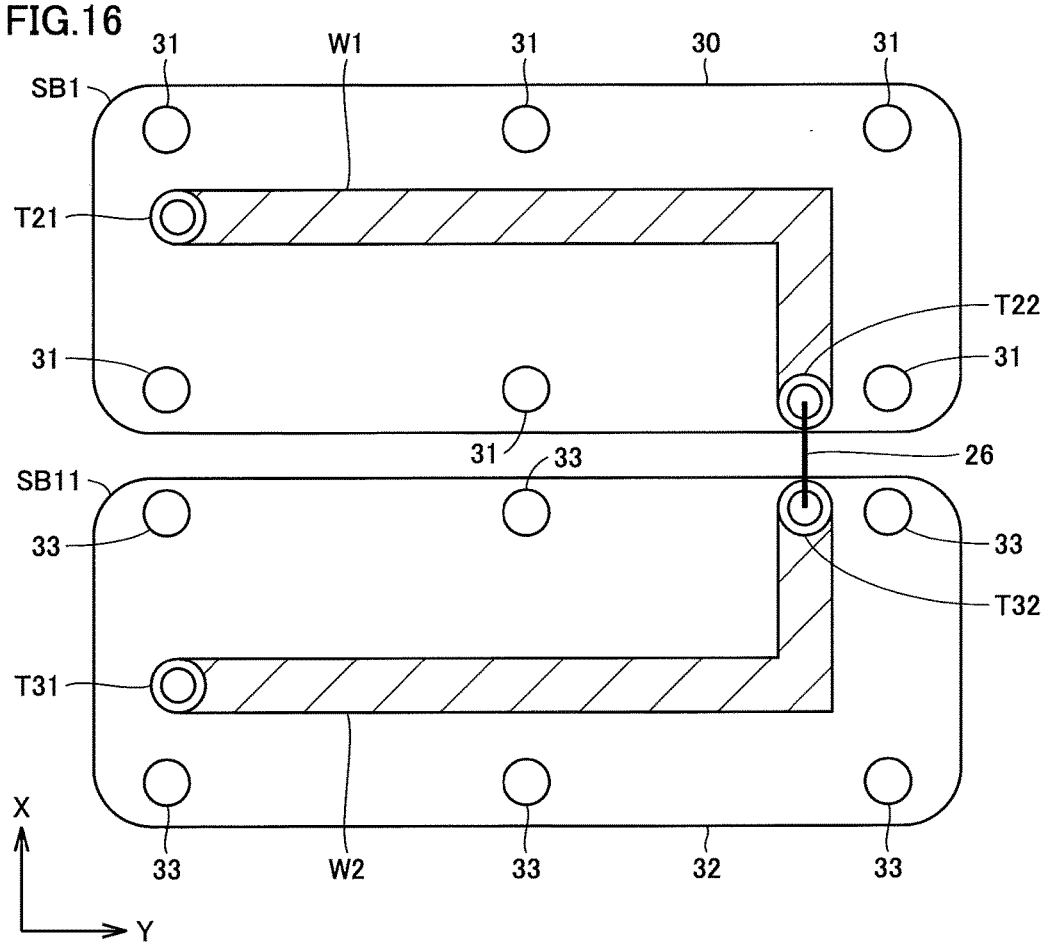
FIG. 16 is a plan view showing a construction of a wiring board shown in FIG. 13.

FIG. 13 is a front view showing a construction of arm A1 included in the multilevel converter according to a second embodiment of this invention and compared with FIG. 8. FIG. 14 is a rear view showing the construction of arm A1 shown in FIG. 13 and compared with FIG. 9. FIG. 15 is a plan view showing the construction of arm A1 shown in FIG. 13. FIG. 16 is a plan view showing a construction of wiring boards SB1 and SB11 shown in FIG. 13.

In FIGS. 13 to 15, arm A1 includes racks LK1A and LK2A. Rack LK1A is addition of wiring boards SB1 to SB4 to rack LK1. Rack LK2A is addition of wiring boards SB11 to SB14 to rack LK2. Wiring boards SB1 to SB4 are inserted among stages ST1 to ST5 and arranged in parallel to stages ST1 to ST5. Wiring boards SB11 to SB14 are inserted among stages ST11 to ST15 and arranged in parallel to stages ST11 to ST15. Wiring boards SB1 to SB4 are arranged as high as wiring boards SB11 to SB14, respectively.

As shown in FIG. 16, wiring boards SB1 and SB11 are disposed in the X direction in the figure. Wiring board SB1 includes a rectangular substrate 30. Substrate 30 has a long side oriented in the Y direction in the figure and a short side oriented in the X direction in the figure. A terminal T21 is formed in the vicinity of a short side on a front surface side of rack LK1A in a surface of substrate 30. A terminal T22 is formed in the vicinity of a rear end portion of a long side on a side of rack LK2A in the surface of substrate 30. A wire W1 in an L shape is formed between terminal T21 and terminal T22. Six holes 31 are provided in a peripheral edge portion of substrate 30. Six pillars 16 between upper and lower stages ST1 and ST2 are inserted in six holes 31. Wiring boards SB2 to SB4 are also constructed similarly to wiring board SB1.

Wiring board SB11 includes a rectangular substrate 32. Substrate 32 has a long side oriented in the Y direction in the figure and a short side oriented in the X direction in the figure. A terminal T31 is formed in the vicinity of a short side on a front surface side of rack LK2A in a surface of substrate 32. A terminal T32 is formed in the vicinity of a rear end portion of a long side on a side of rack LK1A in the surface of substrate 32. A wire W2 in an L shape is formed between terminal T31 and terminal T32. Six holes 33 are provided in a peripheral edge portion of substrate 32. Six pillars 16 between upper and lower stages ST11 and ST12 are inserted in six holes 33. Wiring boards SB12 to SB14 are also constructed similarly to wiring board SB11.

As shown in FIGS. 13 and 15, negative-side terminals T12 in stages ST11 to ST14 of rack LK2A are connected to terminals T21 of wiring boards SB1 to SB4 of rack LK1A through four wires 24, respectively. Terminals T31 of wiring boards SB11 to SB14 of rack LK2A are connected to positive-side terminals T11 in stages ST2 to ST5 of rack LK1A through four wires 24, respectively.

As shown in FIGS. 14 and 15, negative-side terminals T12 in stages ST1 to ST5 of rack LK1A are connected to positive-side terminals T11 in stages ST11 to ST15 of rack LK2A through five wires 25, respectively. Terminals T22 of wiring boards SB1 to SB4 of rack LK1A are connected to terminals T32 of wiring boards SB11 to SB14 of rack LK2A through four wires 26, respectively. For the sake of brevity of the drawings, FIG. 13 does not show wires 25 and 26 and FIG. 14 does not show wire 24.

Figure 17:
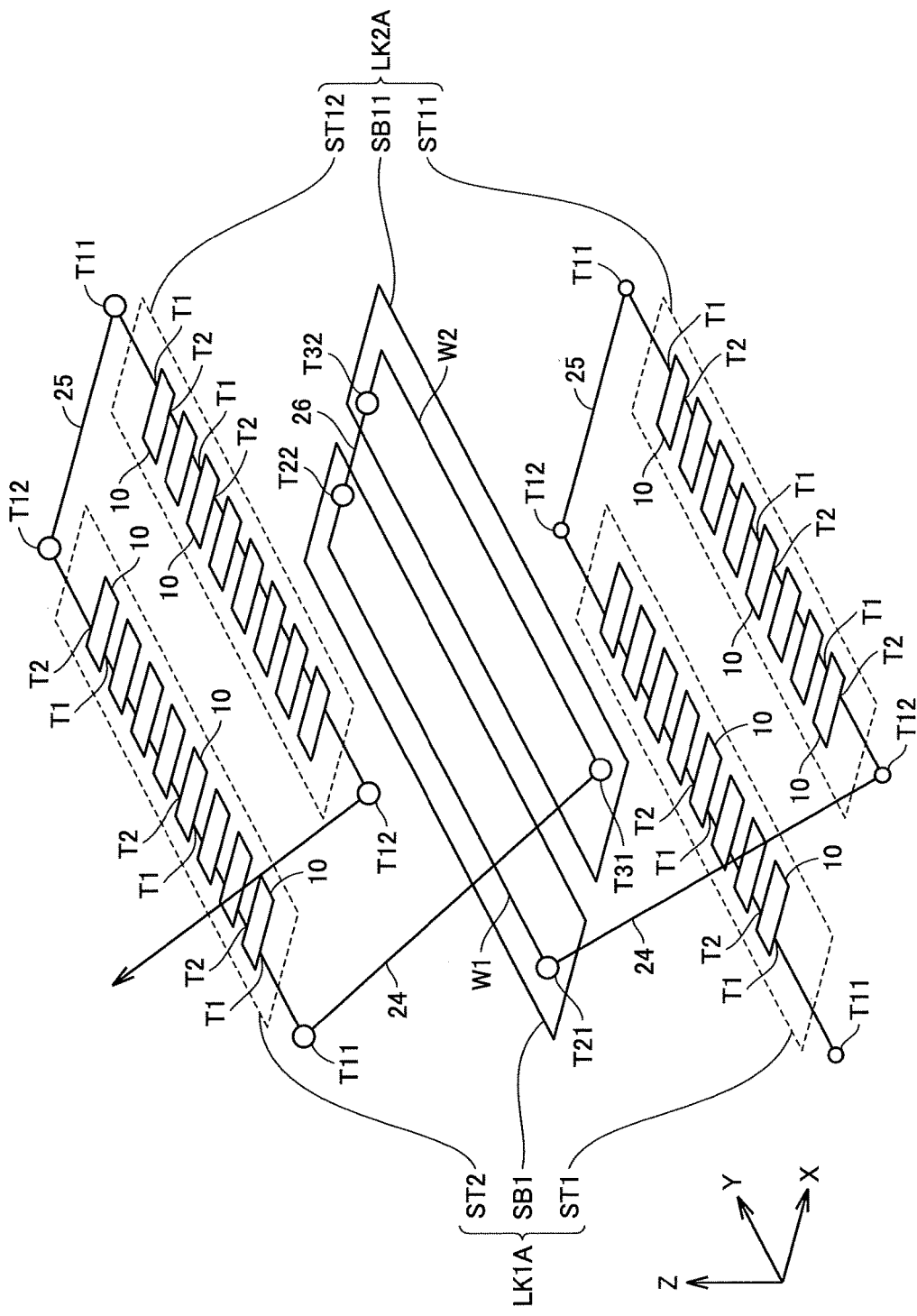
FIG. 17 is a diagram schematically showing a main portion of the arm shown in FIG. 13.

FIG. 17 is a diagram schematically showing a main portion of arm A1. FIG. 17 shows stages ST1 and ST2 (the nth and (n+1)th stages, n being an integer not smaller than 1, and a condition of n=1 being satisfied in FIG. 17) of rack LK1A (a first rack) and wiring board SB1 and stages ST11 and ST12 (the nth and (n+1)th stages, n being an integer not smaller than 1, and a condition of n=1 being satisfied in FIG. 17) of rack LK2A (a second rack) and wiring board SB11. Stage ST11, wiring board SB11, and stage ST12 are arranged as high as stage ST1, wiring board SB1, and stage ST2, respectively, and arranged in the X direction of stage ST1, wiring board SB1, and stage ST2, respectively.

In each of stages ST1 and ST2, positive-side terminal T11 (a first terminal), eight unit cells 10, and negative-side terminal T12 (a second terminal) are disposed in the Y direction in the figure, and eight unit cells 10 are cascaded between terminals T11 and T12. In wiring board SB1, terminal T21 (a third terminal) is connected to a front-surface-side end portion of wire W1 and terminal T22 (a fourth terminal) is connected to a rear-surface-side end portion of wire W1. In wiring board SB11, terminal T31 (a third terminal) is connected to a front-surface-side end portion of wire W2 and terminal T32 (a fourth terminal) is connected to a rear-surface-side end portion of wire W2. In each of stages ST11 and ST12, positive-side terminal T11, eight unit cells 10, and negative-side terminal T12 are disposed in the direction opposite to the Y direction in the figure and eight unit cells 10 are cascaded between terminals T11 and T12.

Negative-side terminal T12 of stage ST1 is connected to positive-side terminal T11 of stage ST11 through wire 25. Eight unit cells 10 in stage ST1, wire 25, and eight unit cells 10 in stage ST11 are connected to form a part of a loop. Negative-side terminal T12 of stage ST11 is connected through wire 24 to terminal T21 of wiring board SB1 located obliquely upward.

Terminal T22 of wiring board SB1 is connected to terminal T32 of wiring board SB11 through wire 26. Wire W1 of wiring board SB1, wire 26, and wire W2 of wiring board SB11 are connected to form a part of a loop. Terminal T31 of wiring board SB11 is connected through wire 24 to positive-side terminal T11 of stage ST2 located obliquely upward.

Negative-side terminal T12 of stage ST2 is connected to positive-side terminal T11 of stage ST12 through wire 25. Eight unit cells 10 in stage ST2, wire 25, and eight unit cells 10 in stage ST12 are connected to form a part of a loop. Eight unit cells 10 in stage ST1, eight unit cells 10 in stage ST11, wire W1 of wiring board SB1, wire W2 of wiring board SB11, eight unit cells 10 in stage ST2, and eight unit cells 10 in stage ST12 are helically cascaded.

Thus, 8×10 unit cells 10 mounted on stages ST1 to ST5 and ST11 to ST15 (two sets of first to Nth stages, with a condition of N=5 being satisfied) of racks LK1A and LK2A (the first to Qth racks, with a condition of Q=2 being satisfied) and eight wires W1 and W2 mounted on wiring boards SB1 to SB4 and SB11 to SB14 are helically cascaded to implement reactor 11 shown in FIG. 4(a) to (c). Each of other arms A2 to A6 is also constructed similarly to arm A1.

The second embodiment obtains an effect the same as in the first embodiment. In addition, since wiring board SB is provided between stages ST, the number of loops P of reactor 11 can be increased and inductance L of reactor 11 can be increased. Since the number of loops P implementing reactor 11 is increased from 5 to 9, inductance L of reactor 11 is $(9/5)^2=3.24$ times as high as the inductance in the first embodiment.

Figure 18:
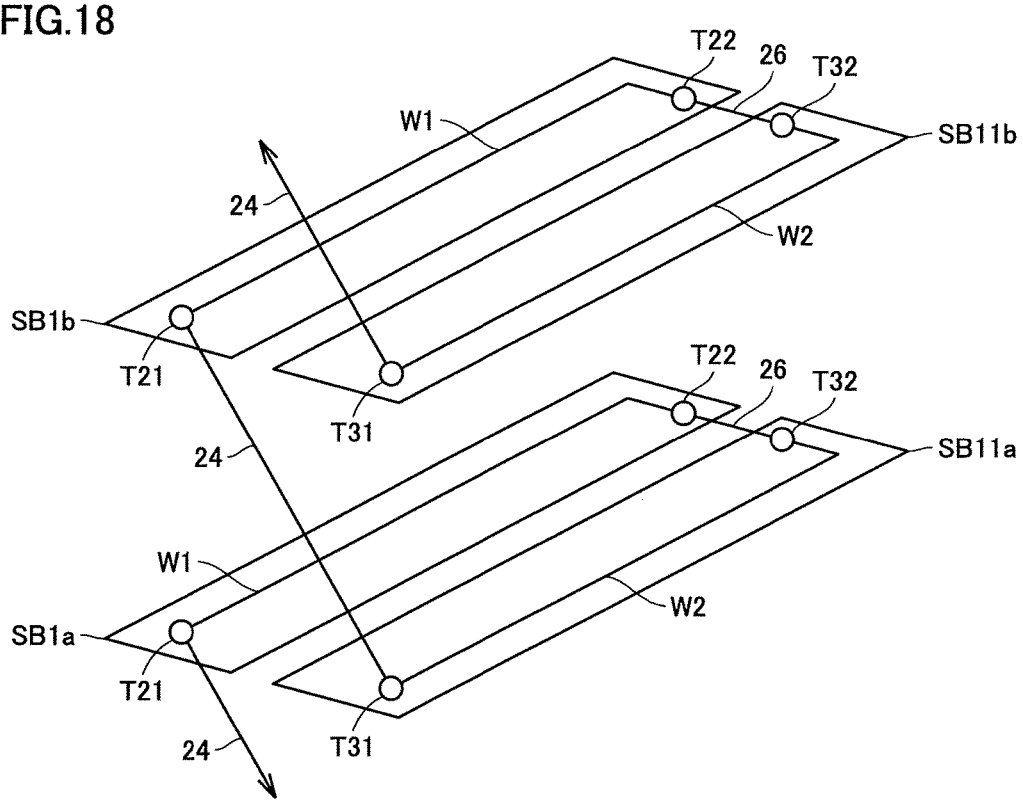
FIG. 18 is a diagram showing a modification of the second embodiment.

FIG. 18 is a diagram showing a modification of the second embodiment and compared with FIG. 17. Referring to FIG. 18, in this modification, J (J being an integer not smaller than 2, with a condition of J=2 being satisfied in FIG. 18) wiring boards SB are provided between two stages ST. FIG. 18 shows two wiring boards SB1a and SB1b (jth and (j+1)th wiring boards, j being an integer not smaller than 1, and a condition of j=1 being satisfied in FIG. 18) provided between stages ST1 and ST2 and two wiring boards SB11a and SB11b (jth and (j+1)th wiring boards, j being an integer not smaller than 1, and a condition of j=1 being satisfied in FIG. 18) provided between stages ST11 and ST12. Wiring boards SB1a and SB1b are disposed sequentially in the direction of height and arranged in parallel to each other. Wiring boards SB11a and SB11b are disposed sequentially in the direction of height and arranged in parallel to each other. Each of wiring boards SB1a and SB1b includes wire W1 connected between terminals T21 and T22. Each of wiring boards SB11a and SB11b includes wire W2 connected between terminals T31 and T32.

Terminal T21 (the third terminal) of wiring board SB1a is connected to negative-side terminal T12 (the second terminal) of stage ST11 located obliquely downward. Terminal T22 (the fourth terminal) of wiring board SB1a is connected to terminal T32 (the fourth terminal) of wiring board SB11a through wire 26. Wire W1 of wiring board SB1a, wire 26, and wire W2 of wiring board SB11a are connected to form a part of a loop. Terminal T31 (the third terminal) of wiring board SB11a is connected through wire 24 to terminal T21 (the third terminal) of wiring board SB1b locate obliquely upward.

Terminal T22 (the fourth terminal) of wiring board SB1b is connected to terminal T32 (the fourth terminal) of wiring board SB11b through wire 26. Wire W1 of wiring board SB1b, wire 26, and wire W2 of wiring board SB11b are connected to form a part of a loop. Terminal T31 (the third terminal) of wiring board SB11b is connected through wire 24 to positive-side terminal T11 (the first terminal) of stage ST2 located obliquely upward. Wires W1, W2, W1, and W2 of wiring boards SB1a, SB11a, SB1b, and SB11b as being helically connected implement a part of a reactor.

In this modification, since two wiring boards SB are provided between two stages ST, the number of loops P of reactor 11 can be increased and inductance L of reactor 11 can be increased. Since the number of loops P implementing reactor 11 is increased from 5 to 13, inductance L of reactor 11 is $(13/5)^2=6.76$ times as high as the inductance in the first embodiment.

Though two wiring boards SB are provided between two stages ST and wires W of 2×2 wiring boards SB are helically connected in this modification, limitation thereto is not intended. Three or more wiring boards SB may be provided between two stages ST and wires W of at least 2×3 wiring boards SB may helically be connected.

Third Embodiment

Figure 19:
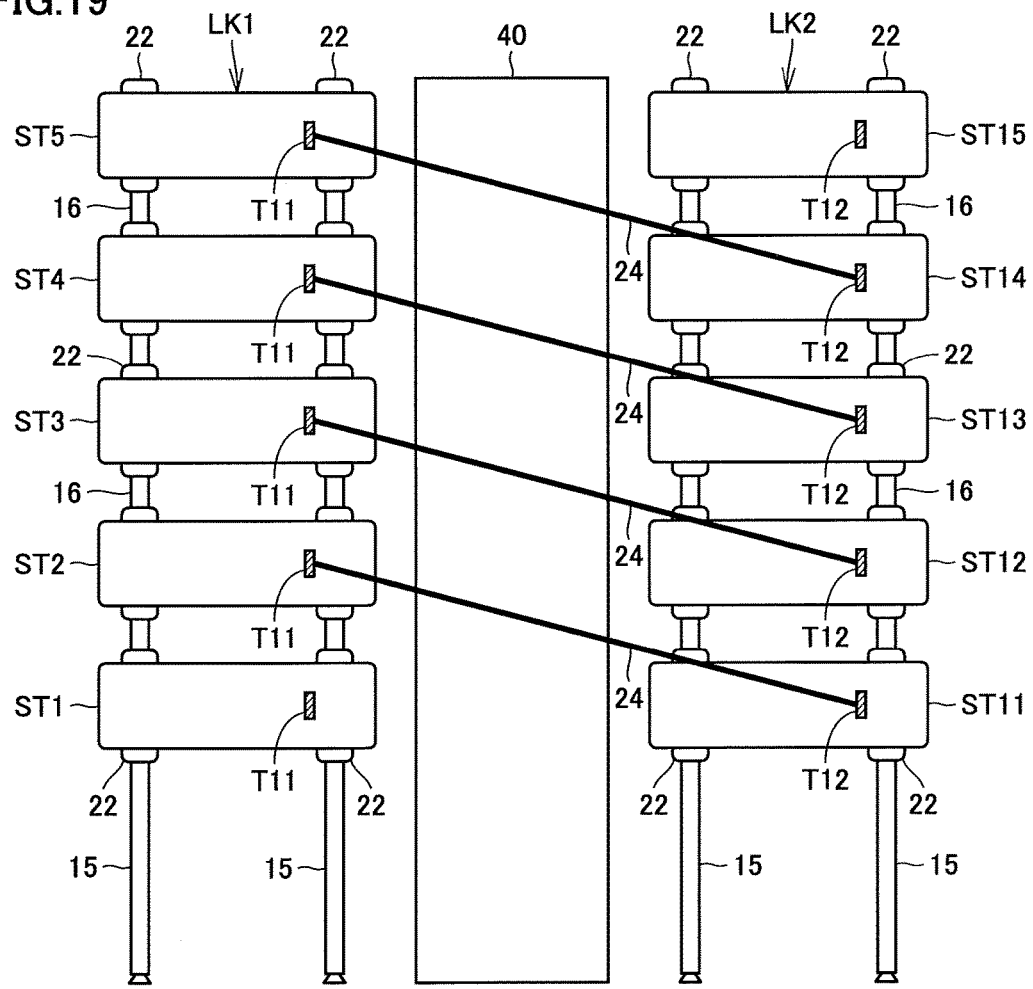
FIG. 19 is a front view showing a construction of an arm included in the multilevel converter according to a third embodiment of this invention.
Figure 20:
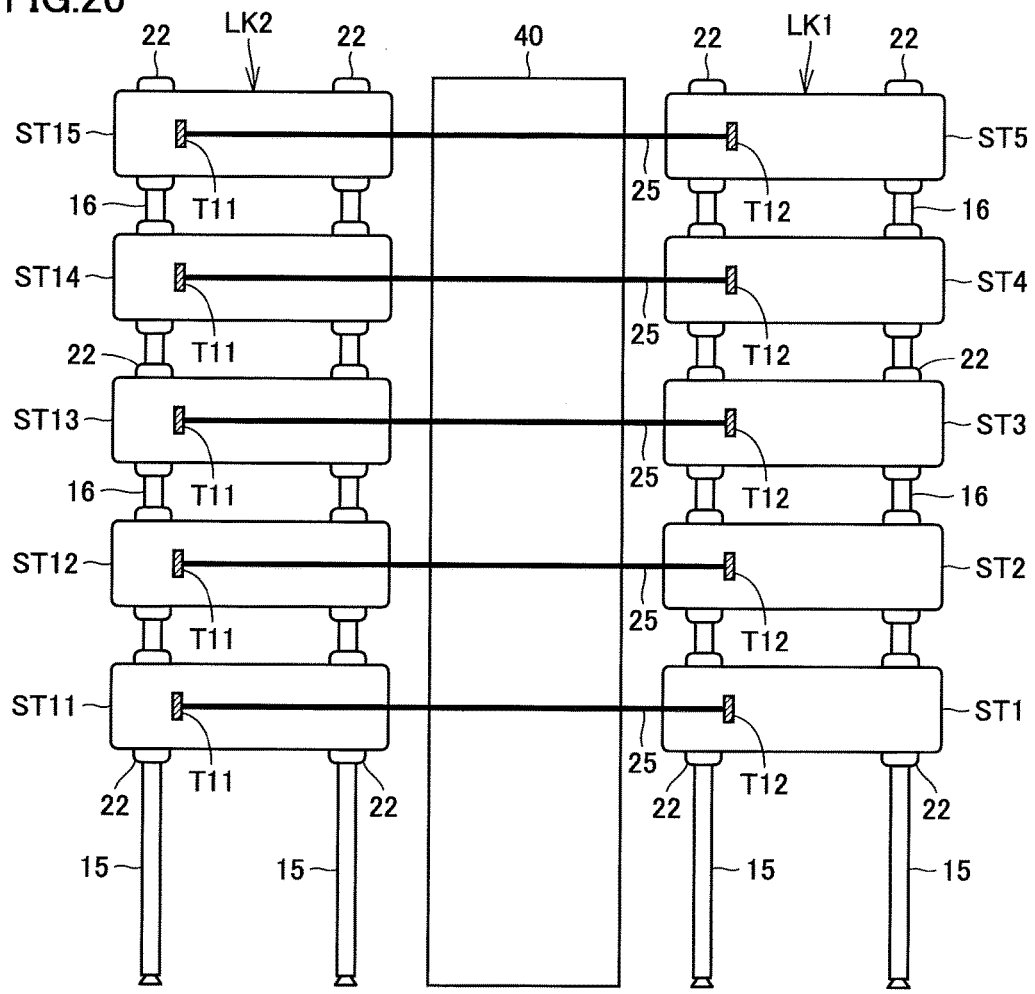
FIG. 20 is a rear view showing the construction of the arm shown in FIG. 19.

FIG. 19 is a front view showing a construction of arm A1 included in the multilevel converter according to a third embodiment of this invention and compared with FIG. 8. FIG. 20 is a rear view showing the construction of arm A1 shown in FIG. 19 and compared with FIG. 9.

Referring to FIGS. 19 and 20, arm A1 is addition of a core 40 to arm A1 in FIGS. 8 and 9. Core 40 is formed, for example, in a shape of a quadrangular prism, and provided in a region surrounded by two racks LK1 and LK2, four wires 24, and five wires 25.

Core 40 is composed, for example, of pure iron. Pure iron has permeability approximately 5000 times as high as that of vacuum. Air is substantially equal in permeability to vacuum. A cross-sectional area of core 40 is assumed as 10% of an area of a loop included in reactor 11 implemented by two racks LK1 and LK2, four wires 24, and five wires 25. Reactor 11 in the first embodiment is assumed to have inductance L of 0.2 mH. Reactor 11 implemented by arm A1 in the present third embodiment has inductance L of 0.2 mH×0.9+0.2 mH×5000×0.1≈100 mH. Inductance L of reactor 11 is 100/0.2=500 times as high as the inductance in the first embodiment. Other arms A2 to A6 are also constructed similarly to arm A1.

Since core 40 is provided inside reactor 11 in the third embodiment, an inductance of reactor 11 can be increased.

Figure 21:
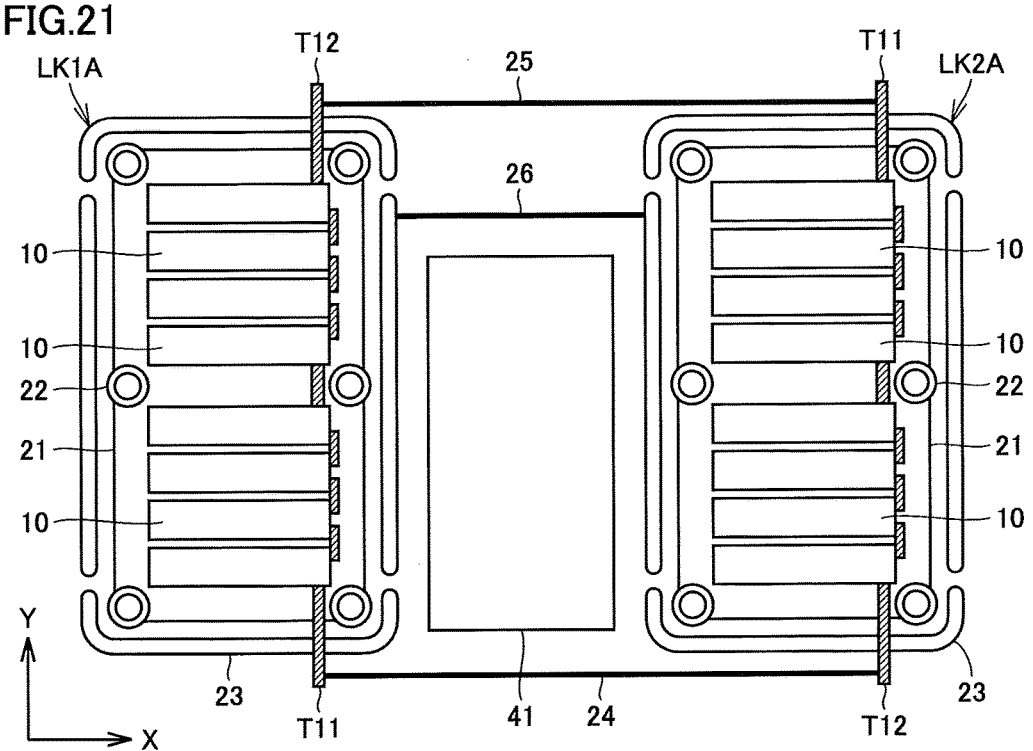
FIG. 21 is a plan view showing a modification of the third embodiment.

FIG. 21 is a diagram showing a modification of the third embodiment and compared with FIG. 15. The modification is addition of a core 41 to arm A1 shown in FIG. 15. Core 41 is formed, for example, in a shape of a quadrangular prism, and provided in a region surrounded by two racks LK1A and LK2A, four wires 24, and four wires 26. Core 41 is composed, for example, of pure iron. This modification can also achieves an increased inductance of reactor 11.

Figure 22:
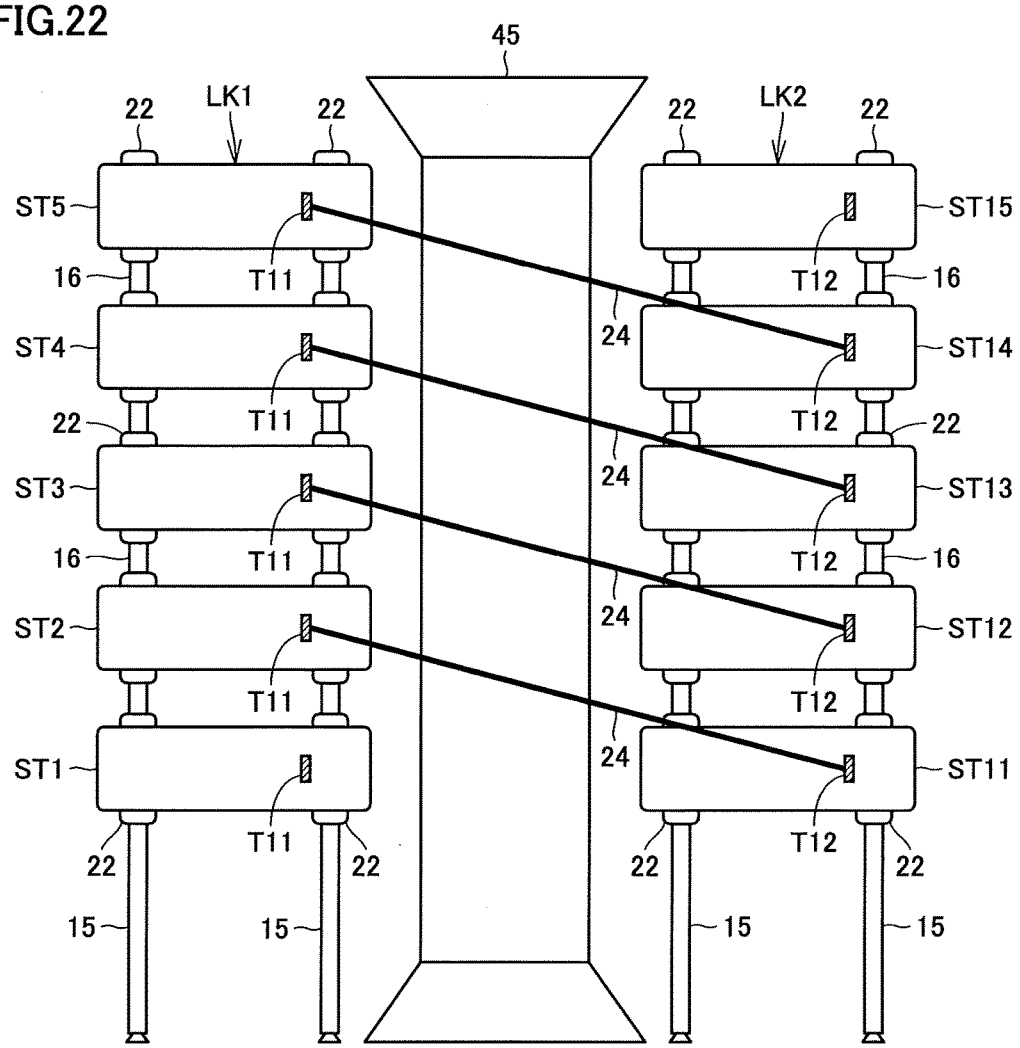
FIG. 22 is a front view showing another modification of the third embodiment.
Figure 23:
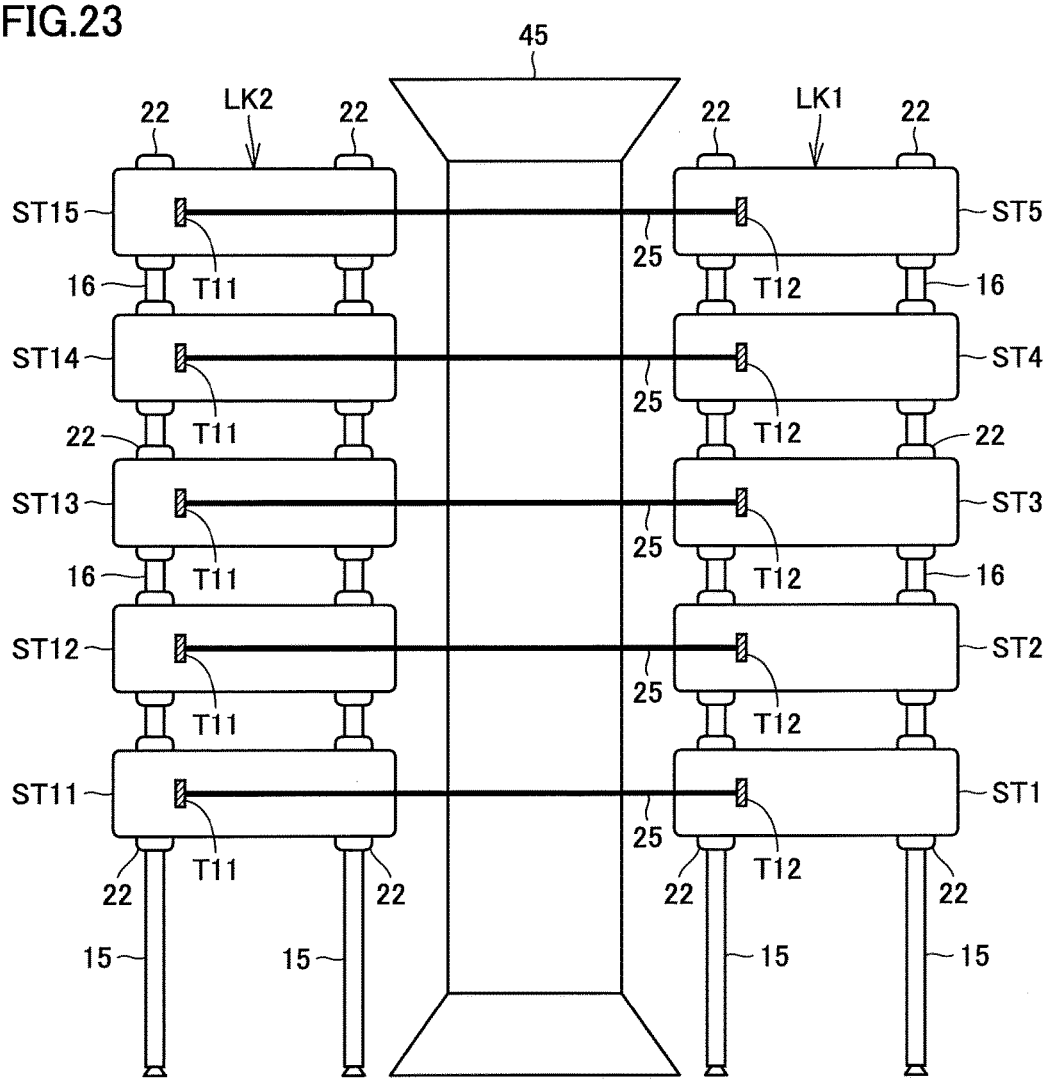
FIG. 23 is a rear view showing a construction of the arm shown in FIG. 22.

FIG. 22 is a front view showing another modification of the third embodiment and compared with FIG. 19. FIG. 23 is a rear view showing the construction of arm A1 shown in FIG. 22 and compared with FIG. 20. Referring to FIGS. 22 and 23, arm A1 is different from arm A1 in the third embodiment in that core 40 is replaced with a pillar 45 of a building accommodating arms A1 to A6. In other words, pillar 45 also serves as core 40. Since pillar 45 of the building is used as core 40 in the modification, it is not necessary to separately provide core 40. Therefore, a device can be reduced in size and cost.

Figure 24:
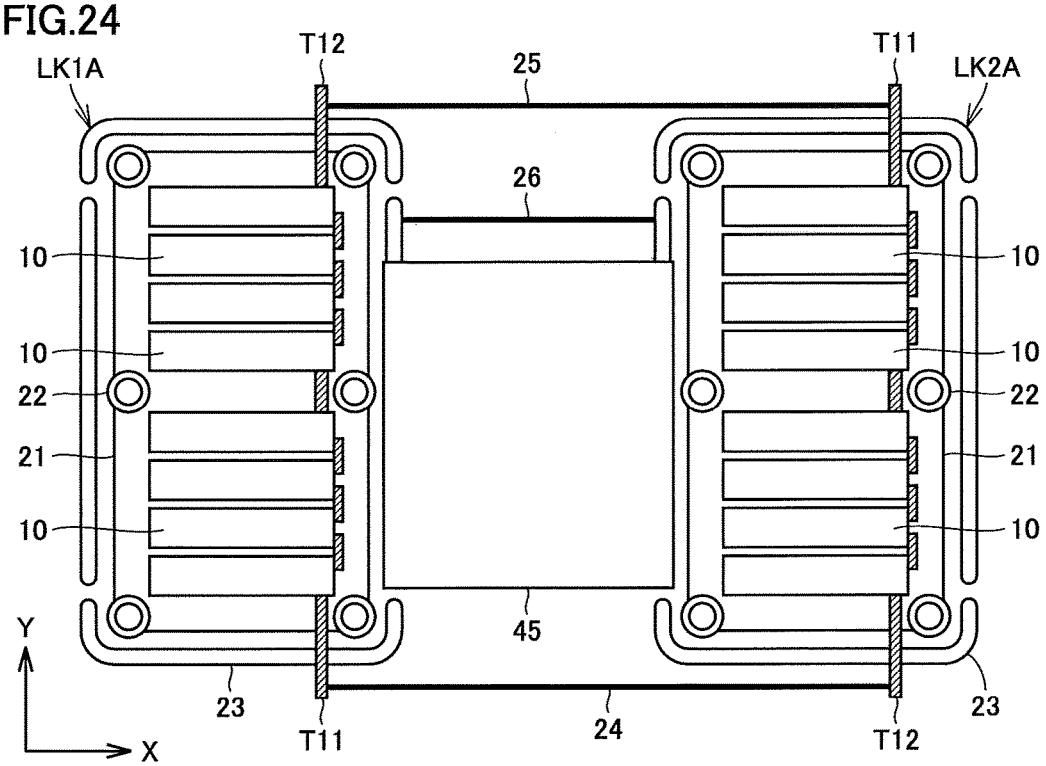
FIG. 24 is a plan view showing yet another modification of the third embodiment.

FIG. 24 is a plan view showing yet another modification of the third embodiment and compared with FIG. 21. Referring to FIG. 24, arm A1 is different from arm A1 in FIG. 21 in that core 41 is replaced with pillar 45 of the building accommodating arms A1 to A6. In other words, pillar 45 also serves as core 41. Since pillar 45 of the building is used as core 41 in the modification, it is not necessary to separately provide core 41. Therefore, a device can be reduced in size and cost.

Fourth Embodiment

Figure 25:
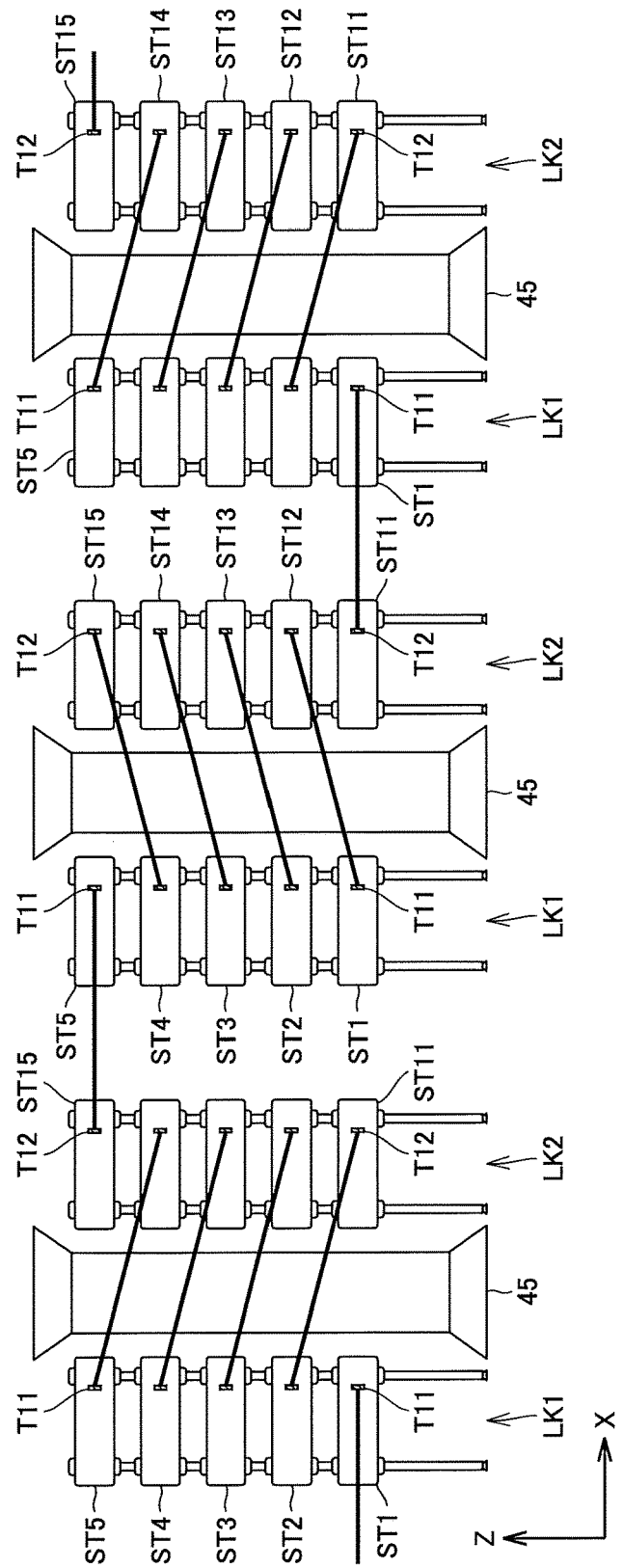
FIG. 25 is a front view showing a construction of an arm included in the multilevel converter according to a fourth embodiment of this invention.
Figure 26:
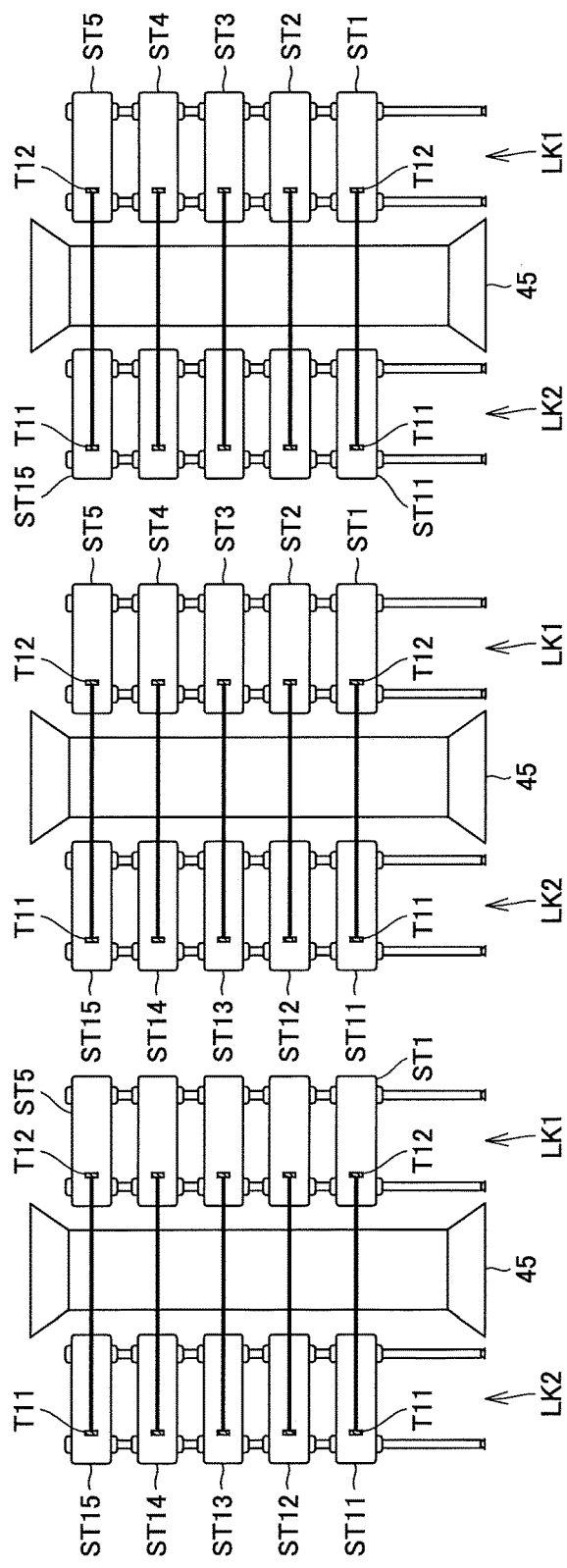
FIG. 26 is a rear view showing the construction of the arm shown in FIG. 25.
Figure 27:
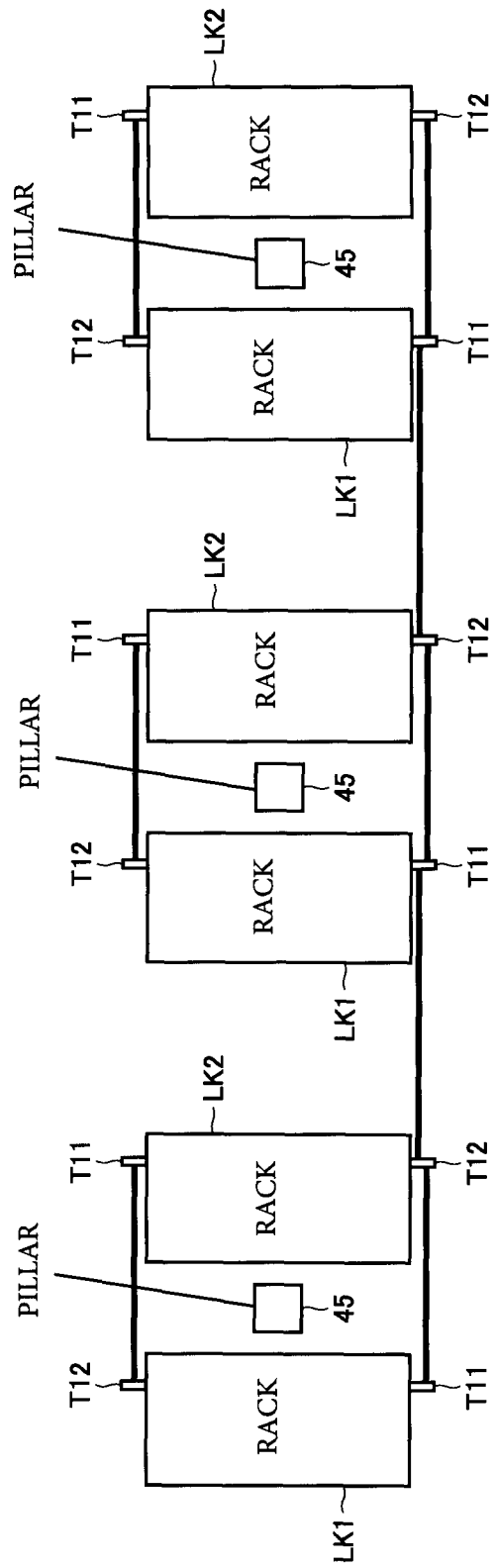
FIG. 27 is a plan view showing the construction of the arm shown in FIG. 25.

FIG. 25 is a front view showing a construction of arm A1 included in the multilevel converter according to a fourth embodiment of this invention and compared with FIG. 19. FIG. 26 is a rear view showing the construction of arm A1 shown in FIG. 25 and compared with FIG. 20. FIG. 27 is a plan view showing the construction of arm A1 shown in FIG. 25.

In FIGS. 25 to 27, arm A1 includes three sets of racks LK1 and LK2 and employs each of three pillars 45 of a building accommodating arm A1 as a core. Three pillars 45 are disposed in the X direction in the figures. Three sets of racks LK1 and LK2 are arranged in the X direction of the figures and one pillar 45 is arranged between each set of racks LK1 and LK2. Three sets of racks LK1 and LK2 in FIG. 25 are referred to as a first set, a second set, and a third set from the left. FIG. 26 shows the first set, the second set, and the third set from the right.

In FIG. 25, positive-side terminal T11 in stage ST1 of rack LK1 in the first set is connected, for example, to positive voltage terminal 3a in FIG. 2. In FIG. 26, negative-side terminals T12 in stages ST1 to ST5 of rack LK1 in each set are connected to positive-side terminals T11 in stages ST11 to ST15 of rack LK2 in each set, respectively.

In FIG. 25, negative-side terminals T12 in stages ST11 to ST14 of rack LK2 in the first set are connected to positive-side terminals T11 in stages ST2 to ST5 of rack LK1 in the first set, respectively. Negative-side terminal T12 in stage ST15 of rack LK2 in the first set is connected to positive-side terminal T11 in stage ST5 of rack LK1 in the second set.

Negative-side terminals T12 in stages ST15 to ST12 of rack LK2 in the second set are connected to positive-side terminals T11 in stages ST4 to ST1 of rack LK1 in the second set, respectively. Negative-side terminal T12 in stage ST11 of rack LK2 in the second set is connected to positive-side terminal T11 in stage ST5 of rack LK1 in the third set.

Negative-side terminals T12 in stages ST11 to ST14 of rack LK2 in the third set are connected to positive-side terminals T11 in stages ST2 to ST5 of rack LK1 in the third set, respectively. Negative-side terminal T12 in stage ST15 of rack LK2 in the third set is connected, for example, to AC terminal 3c in FIG. 3.

Since three sets of racks LK1 and LK2 are connected in series in the fourth embodiment, an inductance three times as high as that in the third embodiment can be obtained.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1 AC power system; B1 to B3 breaker; 2 three-phase transformer; 3 modular multilevel converter; 3a positive voltage terminal; 3b negative voltage terminal; 3c to 3e AC terminal; 4 impedance circuit; 5 DC power supply; A1 to A6 arm; 10, 10A, 10B unit cell; T1 first terminal; T2 second terminal; S1 to S4 switching element; D1 to D4 diode; C capacitor; 11 reactor; LK1, LK2, LK1A, LK2A rack; ST1 to ST5, ST11 to ST15 stage; 15, 16, 45 pillar; T11 positive-side terminal; T12 negative-side terminal; 21, 30, 32 substrate; 22 insulator; 23 insulating shield; 24 to 26 wire; SB1 to SB4, SB11 to SB14, SB1a, SB1b, SB11a, SB11b wiring board; T21, T22, T31, T32 terminal; 31, 33 hole; and 40, 41 core

The invention claimed is:

1. A power conversion device comprising:
   first and second DC connectors supplying and receiving DC power;
   an AC connector supplying and receiving AC power;
   a first arm connected between the first DC connector and the AC connector; and
   a second arm connected between the AC connector and the second DC connector,
   each of the first and second arms including a plurality of cascaded unit cells,
   each unit cell having a switching element and a capacitor,
   at least some of the plurality of cascaded unit cells in at least one of the first and second arms being helically cascaded,
   at least one of the first and second arms includes first to Qth racks,
   each rack has first to Nth stages sequentially disposed in a direction of height, M cascaded unit cells are mounted on each stage,
Q×M unit cells mounted on an nth stage of the first to Qth racks are cascaded to form a part of a loop,
Q×N×M unit cells mounted on the first to Nth stages of the first to Qth racks are helically cascaded, and
each of Q, N, and M is an integer not smaller than 2 and n is an integer not smaller than 1.

2. The power conversion device according to claim 1, wherein
each rack has (N×1) sets of first to Jth wiring boards arranged in respective (N×1) gaps among the first to Nth stages,
the first to Jth wiring boards are sequentially disposed in the direction of height,
a wire is formed in each wiring board,
Q wires formed in a jth wiring board arranged between nth and (n+1)th stages of the first to Qth racks are connected in series to form a part of a loop,
Q×J wires formed in the first to Jth wiring boards arranged between the nth and (n+1)th stages of the first to Qth racks are helically connected in series,
Q×N×M unit cells and Q×(N×1)×J wires mounted on the first to Qth racks are helically connected in series, and
J is an integer not smaller than 2 and j is an integer not smaller than 1.

3. The power conversion device according to claim 1, wherein
Q is set to 2 and at least one of the first and second arms includes first and second racks,
M unit cells in each stage of the first rack are disposed in a first direction,
M unit cells in each stage of the second rack are disposed in a second direction opposite to the first direction,
2×M unit cells mounted on the nth stage of the first and second racks are cascaded to form a part of a loop, and
2×N×M unit cells mounted on the first to Nth stages of the first and second racks are helically cascaded.

4. The power conversion device according to claim 3, wherein
first and second terminals are mounted on each stage,
the M unit cells are cascaded in each stage between the first and second terminals,
the second terminal in the nth stage of the first rack and the first terminal in the nth stage of the second rack are connected to each other,
the second terminal in the nth stage of the second rack and the first terminal in the (n+1)th stage of the first rack are connected to each other, and
2×N×M unit cells are helically cascaded between the first terminal in the first stage of the first rack and the second terminal in the Nth stage of the second rack.

5. The power conversion device according to claim 1, wherein
Q is set to 2 and at least one of the first and second arms includes first and second racks,
M unit cells in each stage of the first rack are disposed in a first direction,
M unit cells in each stage of the second rack are disposed in a second direction opposite to the first direction,
2×M unit cells mounted on the nth stage of the first and second racks are cascaded to form a part of a loop,
each rack further has (N×1) wiring boards arranged in respective (N×1) gaps among the first to Nth stages,
a wire is formed in each wiring board,
two wires formed in the wiring boards arranged between nth and (n+1)th stages of the first and second racks are connected in series to form a part of a loop, and
2×N×M unit cells and 2×(N×1) wires mounted on the first and second racks are helically connected in series.

6. The power conversion device according to claim 5, wherein
first and second terminals are mounted on each stage,
the M unit cells are cascaded in each stage between the first and second terminals,
the second terminal in the nth stage of the first rack and the first terminal in the nth stage of the second rack are connected to each other,
third and fourth terminals are mounted on each wiring board,
the wire is connected in each wiring board between the third and fourth terminals,
the fourth terminals of the wiring boards arranged between the nth and (n+1)th stage of the first and second racks are connected to each other,
the second terminal in the nth stage of the second rack and the third terminal of the wiring board between the nth and (n+1)th stages of the first rack are connected to each other,
the third terminal of the wiring board between the nth and (n+1)th stages of the second rack and the first terminal in the (n+1)th stage of the first rack are connected to each other, and
2×N×M unit cells and 2×(N×1) wires are helically connected in series between the first terminal in the first stage of the first rack and the second terminal in the Nth stage of the second rack.

7. The power conversion device according to claim 1, wherein
each unit cell further has first and second switching elements connected in series between electrodes of the capacitor and first and second diodes connected in anti-parallel to the first and second switching elements, respectively, and
in each of the first and second arms, the first or second switching element of the plurality of unit cells is connected in series.

8. The power conversion device according to claim 1, wherein
each unit cell further has first and second switching elements connected in series between electrodes of the capacitor, third and fourth switching elements connected in series between the electrodes of the capacitor, and first to fourth diodes connected in anti-parallel to the first to fourth switching elements, respectively, and
the first and third switching elements of the plurality of unit cells are connected in series in each of the first and second arms.

9. The power conversion device according to claim 1, the power conversion device further comprising a core, wherein
at least some of the plurality of unit cells are helically cascaded around the core.

10. The power conversion device according to claim 9, wherein
the core also serves as a pillar of a building accommodating the first and second arms.

11. The power conversion device according to claim 1, further comprising:
a plurality of phase modules connected in parallel between the first DC connector and the second DC connector,
each of the plurality of phase modules including
the AC connector supplying and receiving AC power,
the first arm connected between the first DC connector and the AC connector, and the second arm connected between the AC connector and the second DC connector, each of the first and second arms including the plurality of cascaded unit cells, each unit cell having the switching element and the capacitor, at least one of the first and second arms of at least one of the plurality of phase modules including a reactor including at least some of the plurality of cascaded unit cells and a connection wire between the unit cells; and a control device for control of suppression of a circulating current which flows between the plurality of phase modules based on an inductance of the reactor.

12. The power conversion device according to claim 11, wherein the reactor has an inductance not lower than 0.1 mH.

* * * * *